United States Patent
Babcock et al.

(10) Patent No.: US 8,648,391 B2
(45) Date of Patent: Feb. 11, 2014

(54) SIGE HETEROJUNCTION BIPOLAR TRANSISTOR WITH AN IMPROVED BREAKDOWN VOLTAGE-CUTOFF FREQUENCY PRODUCT

(75) Inventors: Jeffrey A. Babcock, Sunnyvale, CA (US); Alexei Sadovnikov, Sunnyvale, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/429,262

(22) Filed: Mar. 23, 2012

(65) Prior Publication Data

US 2013/0249057 A1 Sep. 26, 2013

(51) Int. Cl.
*H01L 29/66* (2006.01)

(52) U.S. Cl.
USPC .............. 257/197; 257/19; 257/47; 257/65; 257/183; 257/191; 257/198; 257/200; 257/273; 257/347; 438/202; 438/239; 438/320; 438/369; 438/309; 438/370; 438/312; 438/313; 438/203; 438/778

(58) Field of Classification Search
USPC ......... 257/47, 19, 65, 77, 183, 191, 197, 198, 257/200, 205, 273–274, 347, 351, 361, 362, 257/378, 370, 500, 502, 552–562, 220, 257/356–358, 423–427, 474–479, 497, 498, 257/511, 517, 525, 526, 528, 539, 542, 565, 257/575, 592, 593, 616, E29.033, E21.093, 257/E21.102, E21.182, E21.207, E21.371, 257/E21.387, E21.403–E21.407, E21.441, 257/E21.445, E21.448–E21.452, E21.544, 257/E33.009, E31.035, E29.104, E29.193; 438/202, 239, 320, 369, 309, 370, 312, 438/313, 203, 235–238, 343, 317, 778
See application file for complete search history.

(56) References Cited

U.S. PATENT DOCUMENTS

| | | | |
|---|---|---|---|
| 5,557,139 A * | 9/1996 | Palara | 257/592 |
| 6,894,366 B2 | 5/2005 | Howard et al. | |
| 2002/0177253 A1 | 11/2002 | Johnson | |
| 2003/0173580 A1 | 9/2003 | Coolbaugh | |
| 2008/0166850 A1 | 7/2008 | Pagette | |
| 2009/0085066 A1 | 4/2009 | Preisler | |

FOREIGN PATENT DOCUMENTS

KR 10-20030018154 A 3/2003

OTHER PUBLICATIONS

Babcock, Jeff A. et al, "CBC8: A 0.25μm SiGe-CBiCMOS Technology Platform on Thick-Film SOI for High-Performance Analog and RF IC Design", 2010 IEEE Bipolar/BiCMOS Circuits and Technology Meeting (BCTM), 2010, pp. 41-44.

Melai J. et al., "A New Sub-Micron 24V SiGe:C Resurf HBT", Proceedings of 2004 International Symposium on Power Semiconductor Devices & ICs, 2004, pp. 33-36.

* cited by examiner

*Primary Examiner* — Steven Loke
*Assistant Examiner* — Junaiden Mirsalahuddin
(74) *Attorney, Agent, or Firm* — Eugene C. Conser; Wade J. Brady, III; Frederick J. Telecky, Jr.

(57) ABSTRACT

The product of the breakdown voltage ($BV_{CEO}$) and the cutoff frequency (fT) of a SiGe heterojunction bipolar transistor (HBT) is increased beyond the Johnson limit by utilizing a doped region with a hollow core that extends down from the base to the heavily-doped buried collector region. The doped region and the buried collector region have opposite dopant types.

6 Claims, 19 Drawing Sheets

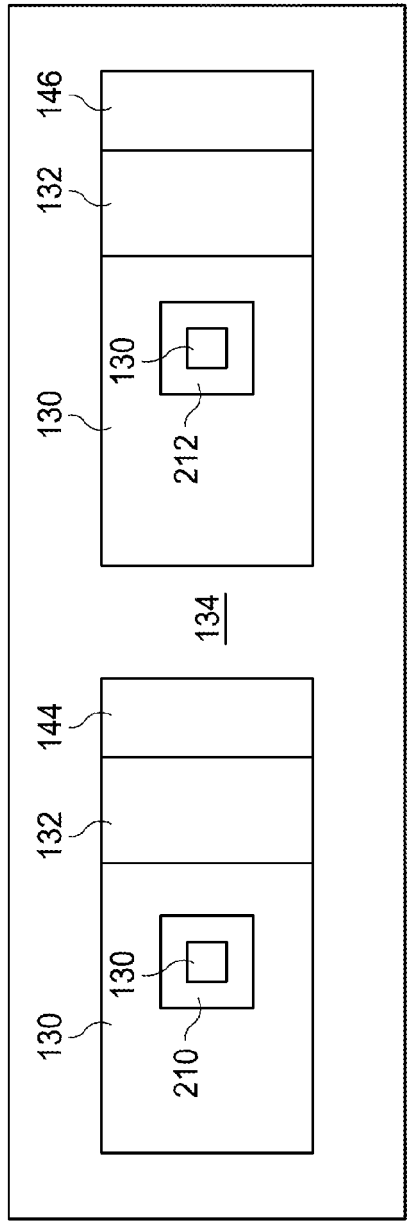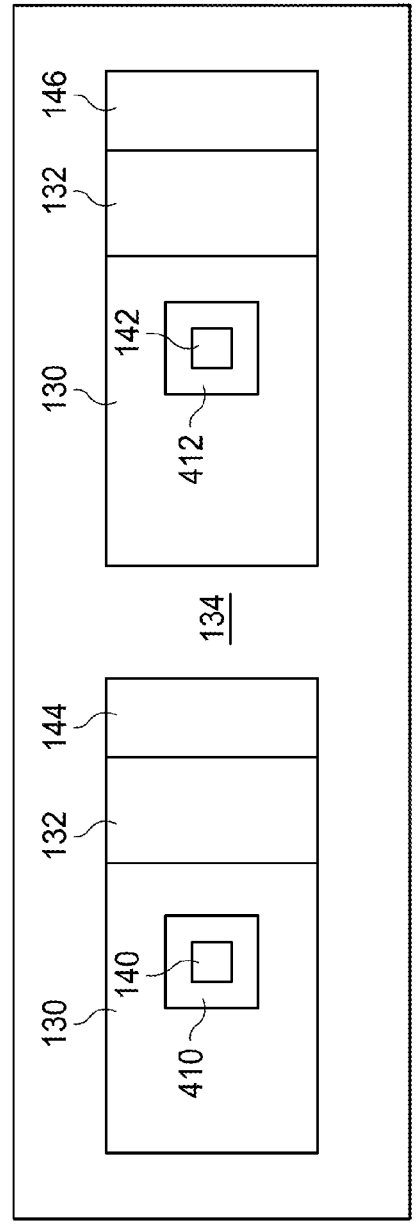

SIGE HETEROJUNCTION BIPOLAR TRANSISTOR WITH AN IMPROVED BREAKDOWN VOLTAGE-CUTOFF FREQUENCY PRODUCT

BACKGROUND OF THE INVENTION

1. Field of the Invention

The present invention relates to a SiGe heterojunction bipolar transistor (HBT) and, more particularly, to a SiGe HBT with an improved breakdown voltage-cutoff frequency product.

2. Description of the Related Art

A bipolar transistor is a well-known structure that has an emitter, a base connected to the emitter, and a collector connected to the base. The emitter has a first conductivity type, the base has a second conductivity type, and the collector has the first conductivity type. For example, an npn bipolar transistor has an n-type emitter, a p-type base, and an n-type collector, while a pnp bipolar transistor has a p-type emitter, an n-type base, and a p-type collector.

When the emitter and base are formed from different semiconductor materials, such as silicon and germanium, respectively, the interface is known as a heterojunction. The heterojunction limits the number of holes that can be injected into the emitter from the base. Limiting the number of injected holes allows the dopant concentration of the base to be increased which, in turn, reduces the base resistance and increases the maximum frequency of the transistor.

FIG. 1 shows a cross-sectional view that illustrates an example of a prior-art SiGe heterojunction bipolar structure 100. As shown in FIG. 1, bipolar structure 100 includes a silicon-on-oxide (SOI) wafer 110, which has a silicon handle wafer 112, a buried insulation layer 114 that touches silicon handle wafer 112, and a single-crystal silicon substrate 116 that touches buried insulation layer 114. Silicon substrate 116, in turn, has a heavily-doped, p conductivity type (p+) buried region 120 and a heavily-doped, n conductivity type (n+) buried region 122.

As further shown in FIG. 1, bipolar structure 100 includes a single-crystal silicon epitaxial structure 130 that touches the top surface of silicon substrate 116. Epitaxial structure 130 has a very low dopant concentration, except for regions of out diffusion. For example, a number of p-type atoms out diffuse from p+ buried layer 120 into epitaxial structure 130, and a number of n-type atoms out diffuse from n+ buried layer 122 into epitaxial structure 130. In the present example, epitaxial structure 130 is a very lightly doped, n conductivity type (n−−−) region, excluding the regions of out diffusion.

Bipolar structure 100 also includes a number of shallow trench isolation structures 132 that touch epitaxial structure 130, and a deep trench isolation structure 134 that touches and extends through epitaxial structure 130 as well as silicon substrate 116 to touch buried insulation layer 114. Buried insulation layer 114 and deep trench isolation structure 134 form an electrically-isolated, single-crystal silicon region 136 and a laterally-adjacent, electrically-isolated, single-crystal silicon region 138.

In addition, bipolar structure 100 includes a lightly-doped, p conductivity type (p−) region 140 that extends from the top surface of silicon epitaxial structure 130 down through epitaxial structure 130 to touch p+ buried region 120, and a lightly-doped, n conductivity type (n−) region 142 that extends from the top surface of silicon epitaxial structure 130 down through epitaxial structure 130 to touch n+ buried region 122.

Bipolar structure 100 also includes a p conductivity type sinker region 144 that extends from the top surface of silicon epitaxial structure 130 down through epitaxial structure 130 to p+ buried region 120, and an n conductivity type sinker region 146 that extends from the top surface of silicon epitaxial structure 130 down through epitaxial structure 130 to n+ buried region 122.

Sinker region 144 includes a heavily-doped, p conductivity type (p+) surface region and a moderately-doped, p conductivity type (p) lower region, while sinker region 146 includes a heavily-doped, n conductivity type (n+) surface region and a moderately-doped, n conductivity type (n) lower region.

Further, bipolar structure 100 includes a SiGe epitaxial structure 150 that touches and lies over silicon epitaxial structure 130, a shallow trench isolation structure 132, and p− region 140, and a SiGe epitaxial structure 152 that touches and lies over silicon epitaxial structure 130, a shallow trench isolation structure 132, and n− region 142.

SiGe epitaxial structure 150 has a number of layers including an upper-most layer and a layer that touches and lies below the upper-most layer. The upper-most layer has a center region 154, and an outer region that touches center region 154. Center region 154 has a heavy dopant concentration and a p conductivity type (p+), which results from out diffusion. The outer region, which horizontally surrounds center region 154, has a very low dopant concentration and, in the present example, an n conductivity type (n−−−).

The layer that touches and lies below the upper-most layer, in turn, includes germanium. The layer also has a heavy dopant concentration and an n conductivity type (n+). In addition, SiGe epitaxial structure 150 includes a single-crystal active region, a polysilicon contact region, and a link region that connects the single-crystal active region to the polysilicon contact region.

Similarly, SiGe epitaxial structure 152 has a number of layers including an upper-most layer and a layer that touches and lies below the upper-most layer. The upper-most layer has a center region 156, and an outer region that touches center region 156. Center region 156 has a heavy dopant concentration and an n conductivity type (n+), which results from out diffusion. The outer region, which horizontally surrounds center region 156, has a very low dopant concentration and, in the present example, an n conductivity type (n−−−).

The layer that touches and lies below the upper-most layer includes germanium. The layer also has a heavy dopant concentration and a p conductivity type (p+). In addition, SiGe epitaxial structure 152 includes a single-crystal active region, a polysilicon contact region, and a link region that connects the single-crystal active region and the polysilicon contact region.

Bipolar structure 100 additionally includes an isolation structure 160 that touches SiGe epitaxial structure 150, and an isolation structure 162 that touches SiGe epitaxial structure 152. Isolation structure 160 has an emitter opening 164 that exposes the single-crystal active region of SiGe epitaxial structure 150, and a contact opening 166 that exposes the polysilicon contact region of SiGe epitaxial structure 150. Similarly, isolation structure 162 has an emitter opening 170 that exposes the single-crystal active region of SiGe epitaxial structure 152, and a contact opening 172 that exposes the polysilicon contact region of SiGe epitaxial structure 152.

Bipolar structure 100 further includes a heavily-doped, p conductivity type (p+) polysilicon structure 180 that touches isolation structure 160 and extends through emitter opening 164 to touch the p+ region 154 of SiGe epitaxial structure 150. Bipolar structure 100 also includes a heavily-doped, n conductivity type (n+) polysilicon structure 182 that touches isolation structure 162 and extends through emitter opening 170 to touch the n+ region 156 of SiGe epitaxial structure 152.

P+ polysilicon structure 180 and p+ region 154 form the emitter, the remaining portion of SiGe epitaxial structure 150 forms the n-type base, and the combination of p+ buried region 120, p− region 140, and p-type sinker region 144 form the collector of a pnp SiGe heterojunction bipolar transistor (HBT) 190. In addition, n+ polysilicon structure 182 and n+ region 156 form the emitter, the remaining portion of SiGe epitaxial structure 152 forms the p-type base, and the combination of n+ buried region 122, n− region 142, and n-type sinker region 146 form the collector of an npn SiGe HBT 192.

The maximum (or cutoff) frequency of pnp SiGe HBT 190 is defined in part by the dopant concentration of p− region 140. As the dopant concentration of p− region 140 increases, the collector resistance decreases and the cutoff frequency of HBT 190 increases. On the other hand, as the dopant concentration of p− region 140 decreases, the collector resistance increases and the cutoff frequency of HBT 190 decreases.

The product of the breakdown voltage and the cutoff frequency produces a relatively constant value, which is commonly known as the Johnson limit. Thus, as a result of the Johnson limit, as the dopant concentration of p− region 140 increases, the cutoff frequency of HBT 190 increases while the breakdown voltage of HBT 190 decreases. On the other hand, as the dopant concentration of p− region 140 decreases, the cutoff frequency of HBT 190 decreases while the breakdown voltage of transistor 190 increases.

Similarly, the cutoff frequency of npn SiGe HBT 192 is defined in part by the dopant concentration of n− region 142. Thus, as a result of the Johnson limit, as the dopant concentration of n− region 142 increases, the cutoff frequency of HBT 192 increases while the breakdown voltage of HBT 192 decreases. On the other hand, as the dopant concentration of n− region 142 decreases, the cutoff frequency of HBT 192 decreases while the breakdown voltage of HBT 192 increases.

Advanced low-voltage SiGe HBTs have broken the Johnson limit. These low-voltage SiGe HBTs, however, do not scale well and cannot be used with voltages that are substantially greater than five volts. Thus, there is a need for a SiGe HBT which can break the Johnson limit and handle high voltages.

BRIEF DESCRIPTION OF THE DRAWINGS

FIGS. 2A-2B are views illustrating a SiGe heterojunction bipolar structure 200 in accordance with the present invention. FIG. 2A is a cross-sectional view. FIG. 2B is a plan view taken along line 2B-2B of FIG. 2A.

FIGS. 4A-4B are views illustrating a SiGe heterojunction bipolar structure 400 in accordance with an alternate embodiment of the present invention. FIG. 4A is a cross-sectional view. FIG. 4B is a plan view taken along line 4B-4B of FIG. 4A.

FIG. 6A is a cross-sectional view. FIG. 6B is a plan view taken along line 6B-6B of FIG. 6A.

DETAILED DESCRIPTION OF THE INVENTION

Figure 2A:
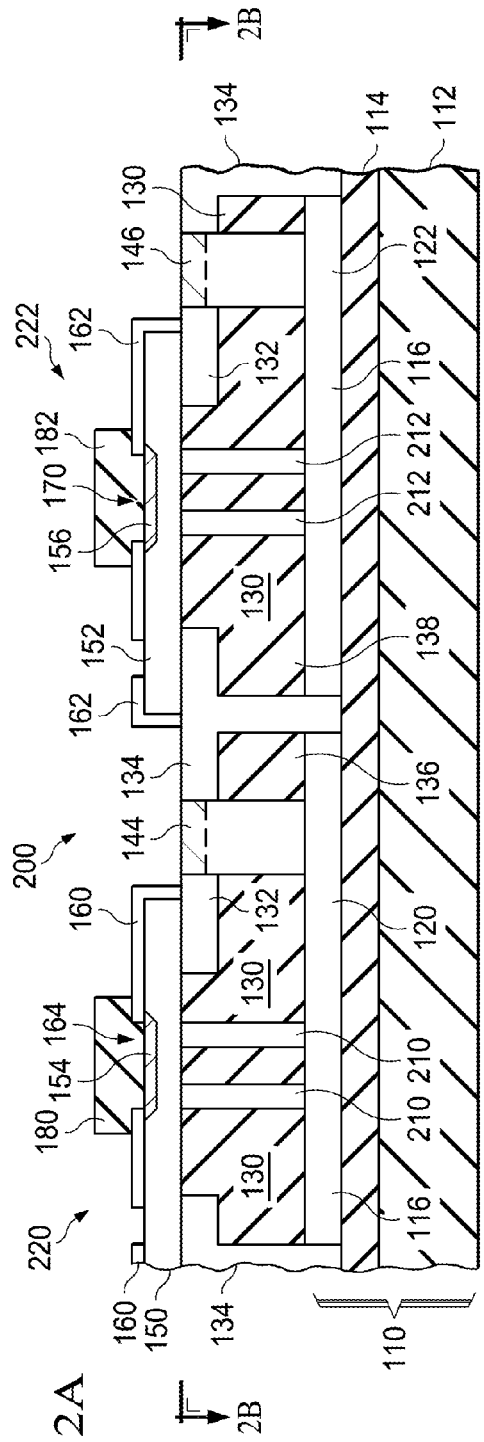

FIGS. 2A-2B show views that illustrate a SiGe heterojunction bipolar structure 200 in accordance with the present invention. FIG. 2A shows a cross-sectional view, while FIG. 2B shows a plan view taken along line 2B-2B of FIG. 2A. SiGe heterojunction bipolar structure 200 is similar to SiGe heterojunction bipolar structure 100 and, as a result, utilizes the same reference numerals to designate the elements that are common to both structures.

As shown in FIGS. 2A-2B, SiGe heterojunction bipolar structure 200 differs from SiGe heterojunction bipolar structure 100 in that SiGe heterojunction bipolar structure 200 replaces p− region 140 with a lightly-doped, n conductivity type (n−) region 210 that has a hollow core. As a result, n− region 210 touches and horizontally surrounds a first center region of silicon epitaxial structure 130, which has the lighter n−−− dopant concentration.

As further shown in FIGS. 2A-2B, n− region 210 extends vertically down from SiGe epitaxial structure 150 to p+ buried region 120. In addition, an outer region of silicon epitaxial structure 130 in electrically-isolated silicon region 136, which has the n−−− dopant concentration, touches and horizontally surrounds n− region 210, which has the larger dopant concentration. Further, although FIG. 2B illustrates n− region 210 with a square shape, n− region 210 can alternately be implemented with a circular, oval, or rectangular shape as well as other shapes.

SiGe heterojunction bipolar structure 200 also differs from SiGe heterojunction bipolar structure 100 in that SiGe heterojunction bipolar structure 200 replaces n− region 142 with a lightly-doped, p conductivity type (p−) region 212 that has a hollow core. As a result, p− region 212 touches and horizontally surrounds a second center region of silicon epitaxial structure 130, which has the lighter n−−− dopant concentration.

As additionally shown in FIGS. 2A-2B, p− region 212 extends vertically down from SiGe epitaxial structure 152 to n+ buried region 122. In addition, an outer region of silicon epitaxial structure 130 in electrically-isolated silicon region 138, which has the n−−− dopant concentration, touches and horizontally surrounds p− region 212, which has a larger dopant concentration. Further, although FIG. 2B illustrates p− region 212 with a square shape, p− region 212 can alternately be implemented with a circular, oval, or rectangular shape as well as other shapes.

P+ polysilicon structure 180 and p+ region 154 form the emitter, n− region 210 and the remaining portion of SiGe epitaxial structure 150 form the base, and p+ buried region 120 and p-type contact region 144 form the collector of a pnp SiGe heterojunction bipolar transistor (HBT) 220. In addition, n+ polysilicon structure 182 and n+ region 156 form the emitter, p− region 212 and the remaining portion of SiGe epitaxial structure 152 form the base, and n+ buried region 122 and n-type contact region 146 form the collector of an npn SiGe HBT 222. PNP SiGe HBT 220 and npn SiGe HBT 222 operate in a conventional manner, and can operate with high voltages, e.g., >5V.

One of the advantages of the present invention is that the product of the breakdown voltage ($BV_{CEO}$) and the cutoff frequency (fT) for pnp SiGe HBT 220 is substantially greater than the ($BV_{CEO}$)(fT) for pnp SiGe HBT 190 (e.g., 240 GHz for pnp SiGe HBT 220 compared to 200 GHz for pnp SiGe HBT 190). Thus, the present invention breaks the Johnson limit.

In addition, the ($BV_{CEO}$)(fT) for npn SiGe HBT 222 is greater than the ($BV_{CEO}$)(fT) for npn SiGe HBT 192 by a similar amount. Other advantages of pnp SiGe HBT 220 and npn SiGe HBT 222 include higher Early voltages (by almost 2×) and lower base resistances in the link regions that connect the single-crystal active regions to the polysilicon contact regions.

Figure 3A:
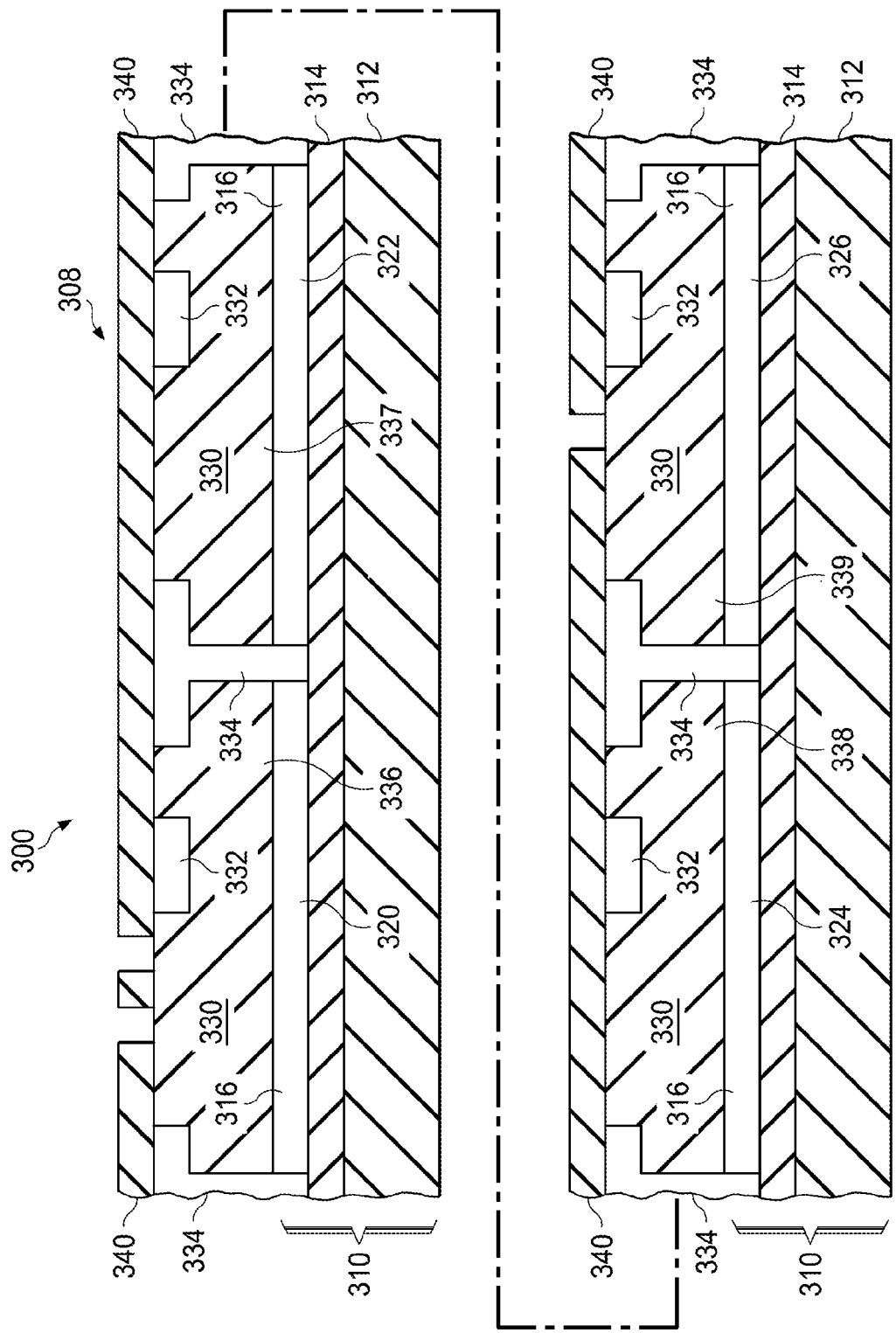
FIGS. 3A-3E are cross-sectional views illustrating a method 300 of forming a SiGe heterojunction bipolar structure in accordance with the present invention.

FIGS. 3A-3E show cross-sectional views that illustrate a method 300 of forming a SiGe heterojunction bipolar structure in accordance with the present invention. As shown in FIG. 3A, the method utilizes a conventionally-formed intermediate structure 308 that includes a silicon-on-oxide (SOI) wafer 310, which has a silicon handle wafer 312, a buried insulation layer 314 that touches silicon handle wafer 312, and a single-crystal silicon substrate 316 that touches buried insulation layer 314. Silicon substrate 316, in turn, has a p+ buried region 320, an n+ buried region 322, a p+ buried region 324, and an n+ buried region 326.

In addition, intermediate structure 308 includes a single-crystal silicon epitaxial structure 330 that touches the top surface of silicon substrate 316. In the present example, epitaxial structure 330 has a very low dopant concentration and an n conductivity type (n---), except for regions of out diffusion. For example, a number of p-type atoms out diffuse from p+ buried layer 320 into epitaxial structure 330, a number of n-type atoms out diffuse from n+ buried layer 322 into epitaxial structure 330, a number of p-type atoms out diffuse from p+ buried layer 324 into epitaxial structure 330, and a number of n-type atoms out diffuse from n+ buried layer 326 into epitaxial structure 330. As a result, substantially all of epitaxial structure 330 has a very low dopant concentration.

Intermediate structure 308 also includes a number of shallow trench isolation structures 332 that touch epitaxial structure 330, and a deep trench isolation structure 334 that touches and extends through epitaxial structure 330 as well as silicon substrate 316 to touch buried insulation layer 314.

Deep trench isolation structure 334 forms an electrically-isolated, single-crystal silicon region 336, a laterally-adjacent, electrically-isolated, single-crystal silicon region 337, a laterally-adjacent, electrically-isolated, single-crystal silicon region 338, and a laterally-adjacent, electrically-isolated, single-crystal silicon region 339.

Figure 3B:
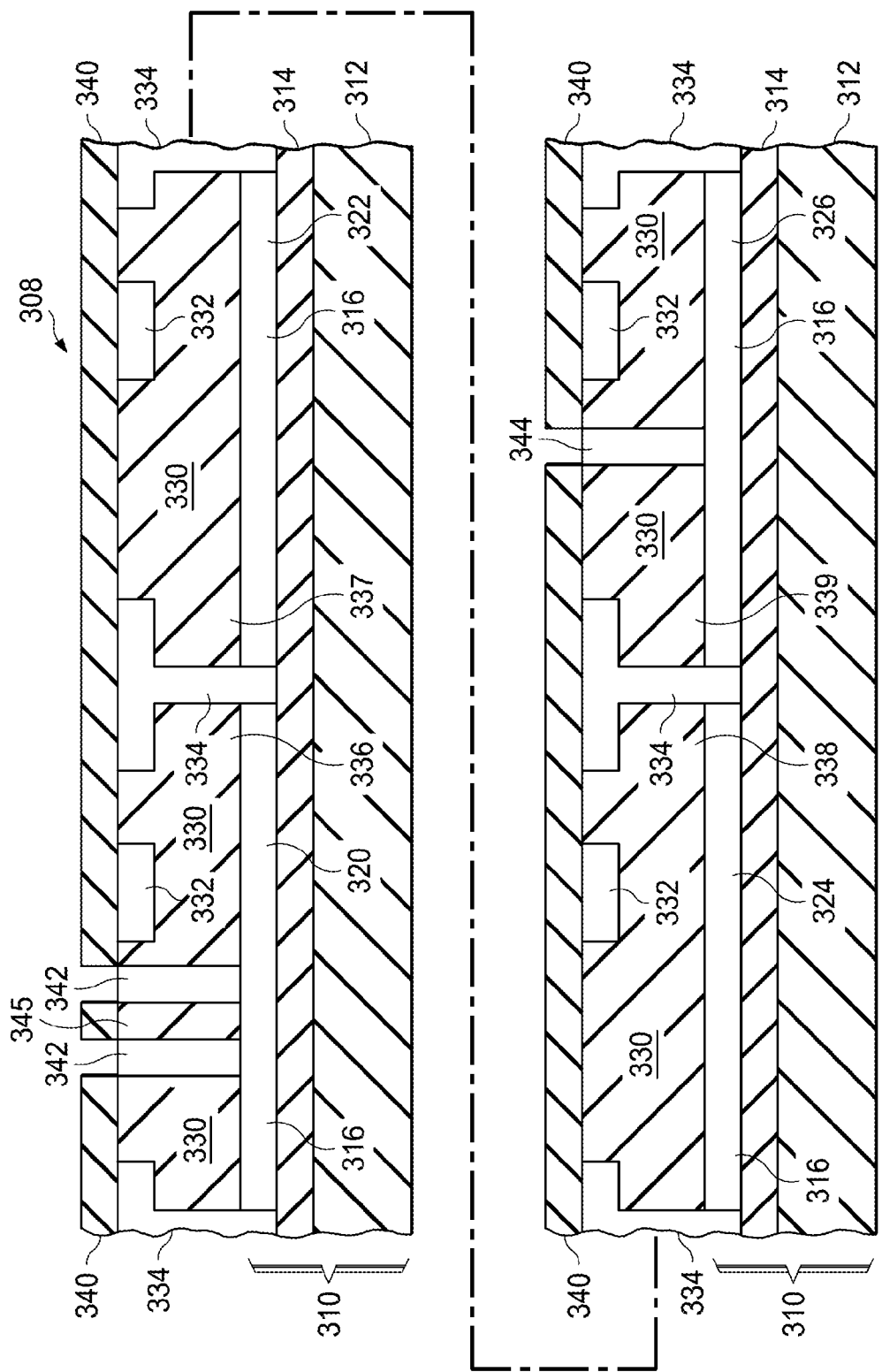

As further shown in FIG. 3A, method 300 begins by forming a patterned photoresist layer 340 in a conventional manner to touch the top surface of epitaxial structure 330. Following the formation of patterned photoresist layer 340, as shown in FIG. 3B, an n-type dopant, such as phosphorous or arsenic, is implanted through patterned photoresist layer 340 to form an n– region 342 and an n– region 344. N– region 342, in turn, has a hollow core. As a result, n– region 342 touches and horizontally surrounds a first center region 345 of silicon epitaxial structure 330, which has a lighter dopant concentration (n---).

As further shown in FIG. 3B, n– region 342 extends from the top surface of epitaxial structure 330 vertically down through epitaxial structure 330 to touch p+ buried region 320, while n– region 344 extends from the top surface of epitaxial structure 330 vertically down through epitaxial structure 330 to touch n+ buried region 326. In addition, an outer region of silicon epitaxial structure 330 in electrically-isolated silicon region 336, which has the n--- dopant concentration, touches and horizontally surrounds n– region 342, which has the larger dopant concentration. After the n– regions 342 and 344 have been formed, patterned photoresist layer 340 is removed in a conventional manner.

Figure 3C:
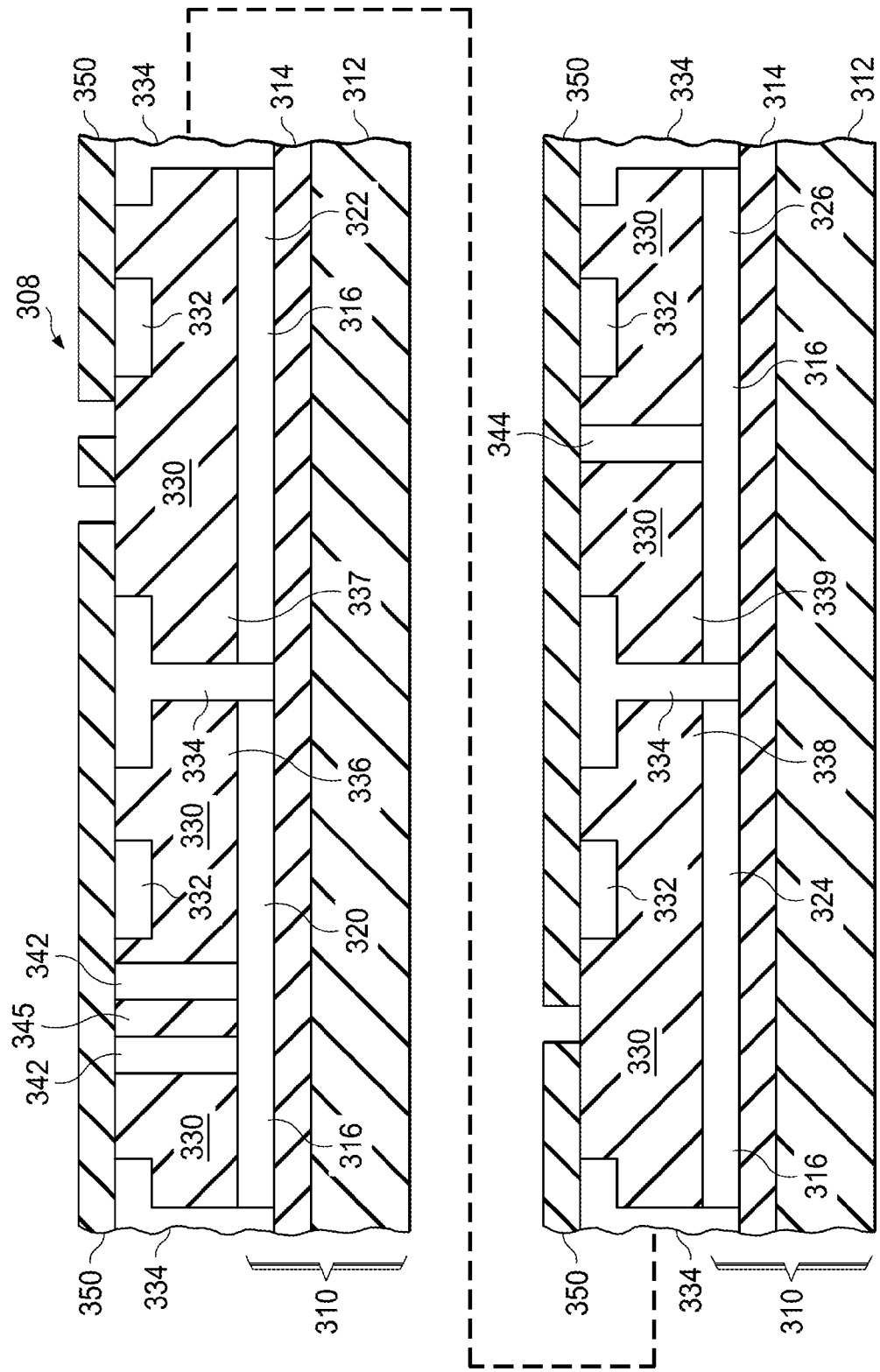
Figure 3D:
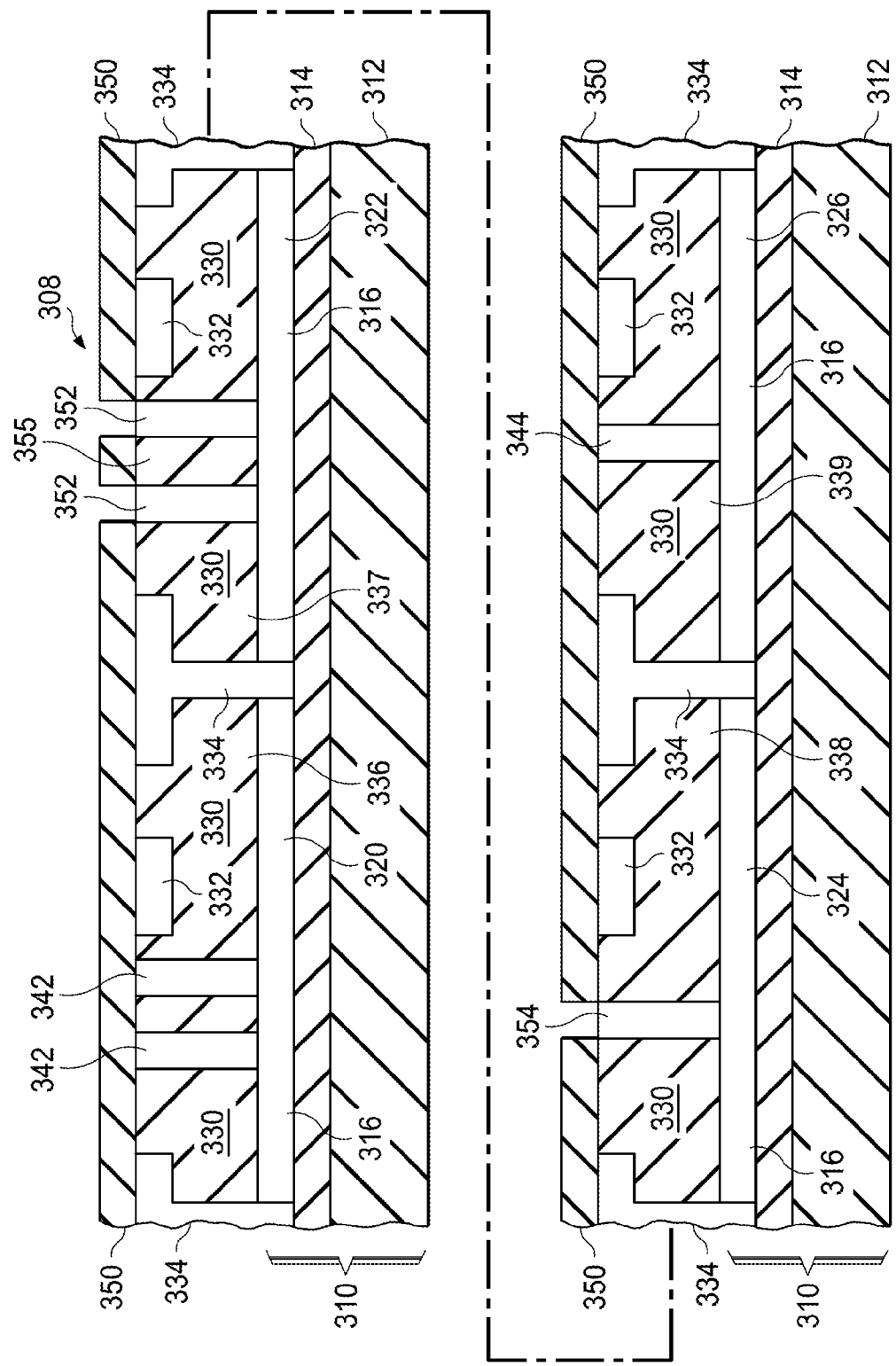

As shown in FIG. 3C, following the removal of patterned photoresist layer 340, a patterned photoresist layer 350 is formed in a conventional manner to touch the top surface of epitaxial structure 330. Following the formation of patterned photoresist layer 350, as shown in FIG. 3D, a p-type dopant, such as boron, is implanted through patterned photoresist layer 350 to form a p– region 352 and a p– region 354. P– region 352, in turn, has a hollow core. As a result, p– region 352 touches and horizontally surrounds a second center region 355 of silicon epitaxial structure 330, which has a lighter dopant concentration (n---).

As further shown in FIG. 3D, p– region 352 extends from the top surface of epitaxial structure 330 vertically down through epitaxial structure 330 to touch n+ buried region 322, while p– region 354 extends from the top surface of epitaxial structure 330 vertically down through epitaxial structure 330 to touch p+ buried region 324. In addition, an outer region of silicon epitaxial structure 330 in electrically-isolated silicon region 337, which has the n--- dopant concentration, touches and horizontally surrounds p– region 352, which has a larger dopant concentration. After the p– regions 352 and 354 have been formed, patterned photoresist layer 350 is removed in a conventional manner.

Figure 3E:
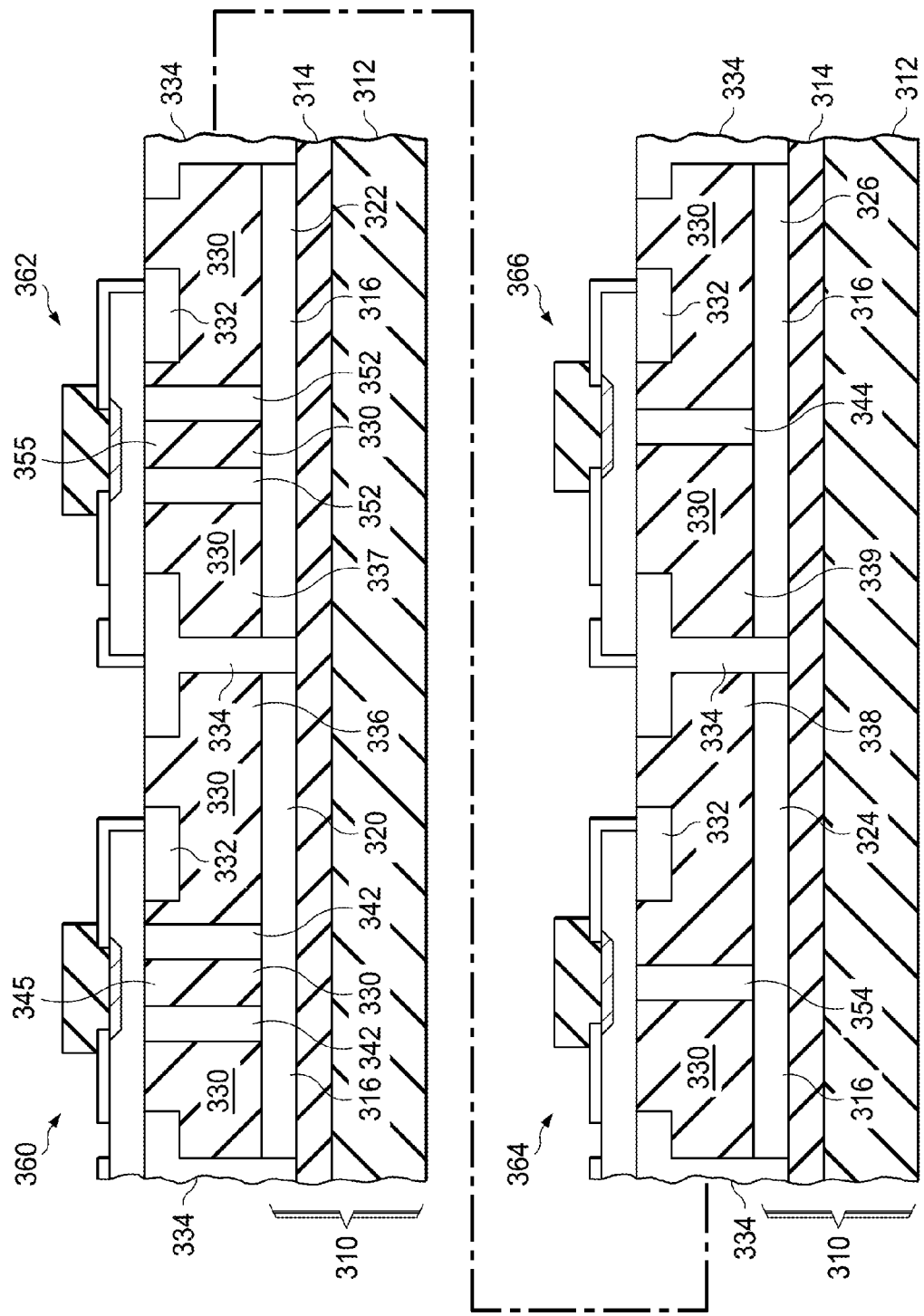

As shown in FIG. 3E, method 300 then continues with the conventional formation of p-type and n-type collector sinker regions (which can alternately be formed before the n– regions 342 and 344, and the p– regions 352 and 354 are formed). Method 300 then follows conventional steps to form a pnp SiGe HBT 360, an npn SiGe HBT 362, a pnp SiGe HBT 364, and an npn SiGe HBT 366.

Figure 1:
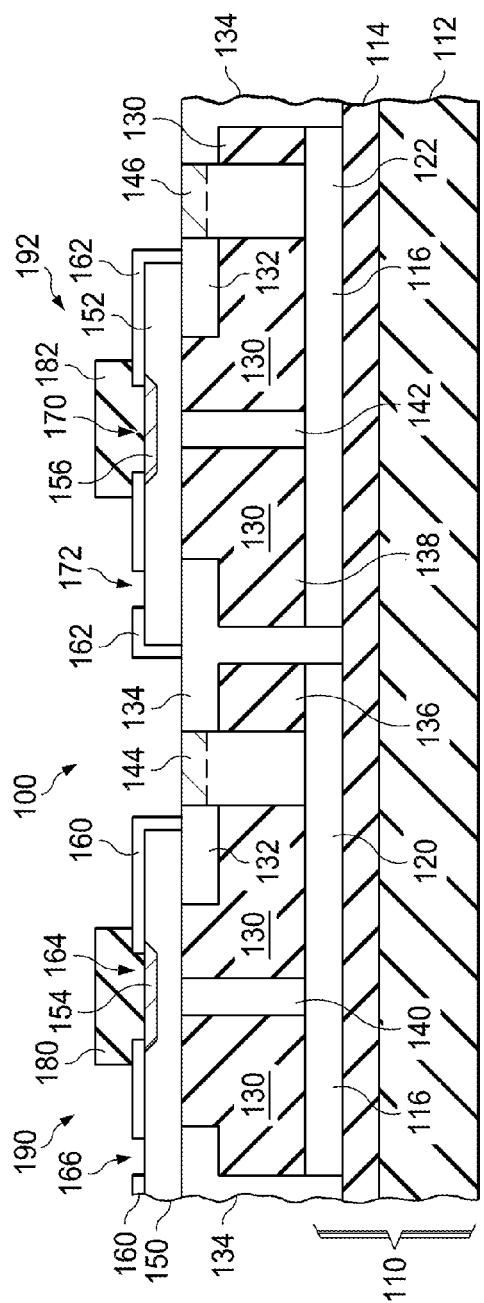
FIG. 1 is a cross-sectional view illustrating an example of a prior-art SiGe heterojunction bipolar structure 100.

As shown in FIGS. 2A and 3E, pnp SiGe HBT 360 and npn SiGe HBT 362 are substantially identical to pnp SiGE HBT 220 and npn SiGe HBT 222, respectively. In addition, as shown in FIGS. 1 and 3E, pnp SiGe HBT 364 and npn SiGe HBT 366 are substantially identical to pnp SiGE HBT 190 and npn SiGe HBT 192, respectively.

Thus, as illustrated in FIG. 3E, one of the advantages of method 300 is that pnp SiGe HBT 220 and npn SiGe HBT 222 can be formed at the same time that pnp SiGe HBT 190 and npn SiGe HBT 192 are formed without any additional masking steps. Thus, for example, HBTs 360, 362, 364, and 366 can each operate at the same frequency, with HBTs 360 and 362 providing a greater breakdown voltage.

Figure 4A:
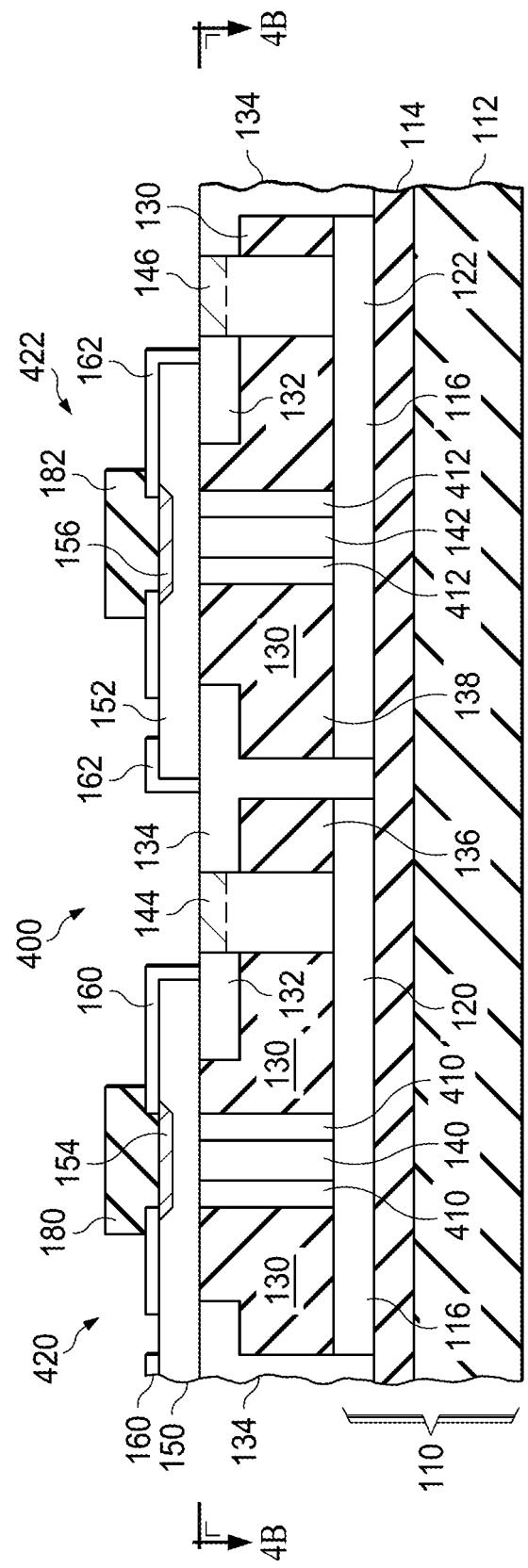

FIGS. 4A-4B show views that illustrate a SiGe heterojunction bipolar structure 400 in accordance with an alternate embodiment of the present invention. FIG. 4A shows a cross-sectional view, while FIG. 4B shows a plan view taken along line 4B-4B of FIG. 4A. SiGe heterojunction bipolar structure 400 is similar to SiGe heterojunction bipolar structure 100 and, as a result, utilizes the same reference numerals to designate the elements that are common to both structures.

As shown in FIGS. 4A-4B, SiGe heterojunction bipolar structure 400 differs from SiGe heterojunction bipolar structure 100 in that SiGe heterojunction bipolar structure 400 further includes an n– region 410 with a hollow core that touches and horizontally surrounds p– region 140. N– region 410 extends vertically down from SiGe epitaxial structure 150 to touch p+ buried region 120.

In addition, an outer region of silicon epitaxial structure 130 in electrically-isolated silicon region 136, which has the n--- dopant concentration, touches and horizontally surrounds n– region 410, which has a larger dopant concentration. Further, although FIG. 4B illustrates n− region 410 with a square shape, n− region 410 can alternately be implemented with a circular, oval, or rectangular shape as well as other shapes.

SiGe heterojunction bipolar structure 400 also differs from SiGe heterojunction bipolar structure 100 in that SiGe heterojunction bipolar structure 400 includes a p− region 412 with a hollow core that touches and horizontally surrounds n− region 142. P− region 412 extends vertically down from SiGe epitaxial structure 152 to n+ buried region 122.

In addition, an outer region of silicon epitaxial structure 130 in electrically-isolated silicon region 138, which has the n−−− dopant concentration, touches and horizontally surrounds p− region 412, which has a larger dopant concentration. Further, although FIG. 4B illustrates p− region 412 with a square shape, p− region 412 can alternately be implemented with a circular, oval, or rectangular shape as well as other shapes.

P+ polysilicon structure 180 and p+ region 154 form the emitter, n− region 410 and the remaining portion of SiGe epitaxial structure 150 form the base, and the combination of p+ buried region 120, p− region 140, and p-type contact region 144 forms the collector of an pnp SiGe heterojunction bipolar transistor (HBT) 420.

In addition, n+ polysilicon structure 182 and n+ region 156 form the emitter, p− region 412 and the remaining portion of SiGe epitaxial structure 152 form the base, and the combination of n+ buried region 122, n− region 142, and n-type contact region 146 forms the collector of an npn SiGe HBT 422. PNP SiGe HBT 420 and npn SiGe HBT 422 operate in a conventional manner, can operate with high voltages, and have the same advantages as pnp SiGe HBT 220 and npn SiGe HBT 222.

Figure 5A:
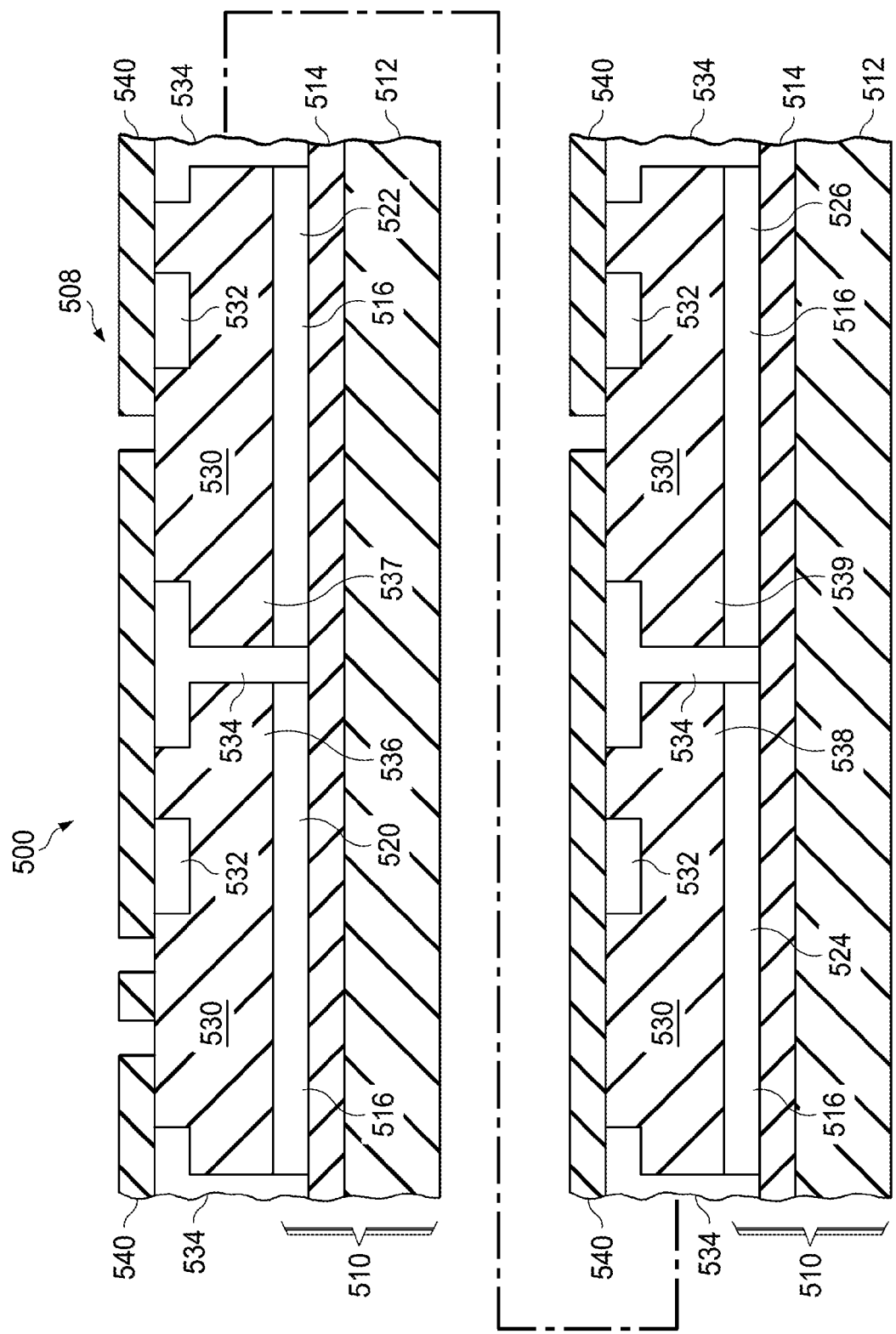
FIGS. 5A-5E are cross-sectional views illustrating a method 500 of forming a SiGe heterojunction bipolar structure in accordance with an alternate embodiment of the present invention.

FIGS. 5A-5E show cross-sectional views that illustrate a method 500 of forming a SiGe heterojunction bipolar structure in accordance with an alternate embodiment of the present invention. As shown in FIG. 5A, the method utilizes a conventionally-formed base structure 508 that includes a silicon-on-oxide (SOI) wafer 510, which has a silicon handle wafer 512, a buried insulation layer 514 that touches silicon handle wafer 512, and a single-crystal silicon substrate 516 that touches buried insulation layer 514. Silicon substrate 516, in turn, has a p+ buried region 520, an n+ buried region 522, a p+ buried region 524, and an n+ buried region 526.

In addition, base structure 508 includes a single-crystal silicon epitaxial structure 530 that touches the top surface of silicon substrate 516. In the present example, epitaxial structure 530 has a very low dopant concentration and an n conductivity type (n−−−), except for regions of out diffusion. For example, a number of p-type atoms out diffuse from p+ buried layer 520 into epitaxial structure 530, a number of n-type atoms out diffuse from n+ buried layer 522 into epitaxial structure 530, a number of p-type atoms out diffuse from p+ buried layer 524 into epitaxial structure 530, and a number of n-type atoms out diffuse from n+ buried layer 526 into epitaxial structure 530. As a result, substantially all of epitaxial structure 530 has a very low dopant concentration.

Base structure 508 also includes a number of shallow trench isolation structures 532 that touch epitaxial structure 530, and a deep trench isolation structure 534 that touches and extends through epitaxial structure 530 as well as silicon substrate 516 to touch buried insulation layer 514. Deep trench isolation structure 534 forms an electrically-isolated, single-crystal silicon region 536, a laterally-adjacent, electrically-isolated, single-crystal silicon region 537, a laterally-adjacent, electrically-isolated, single-crystal silicon region 538, and a laterally-adjacent, electrically-isolated, single-crystal silicon region 539.

Figure 5B:
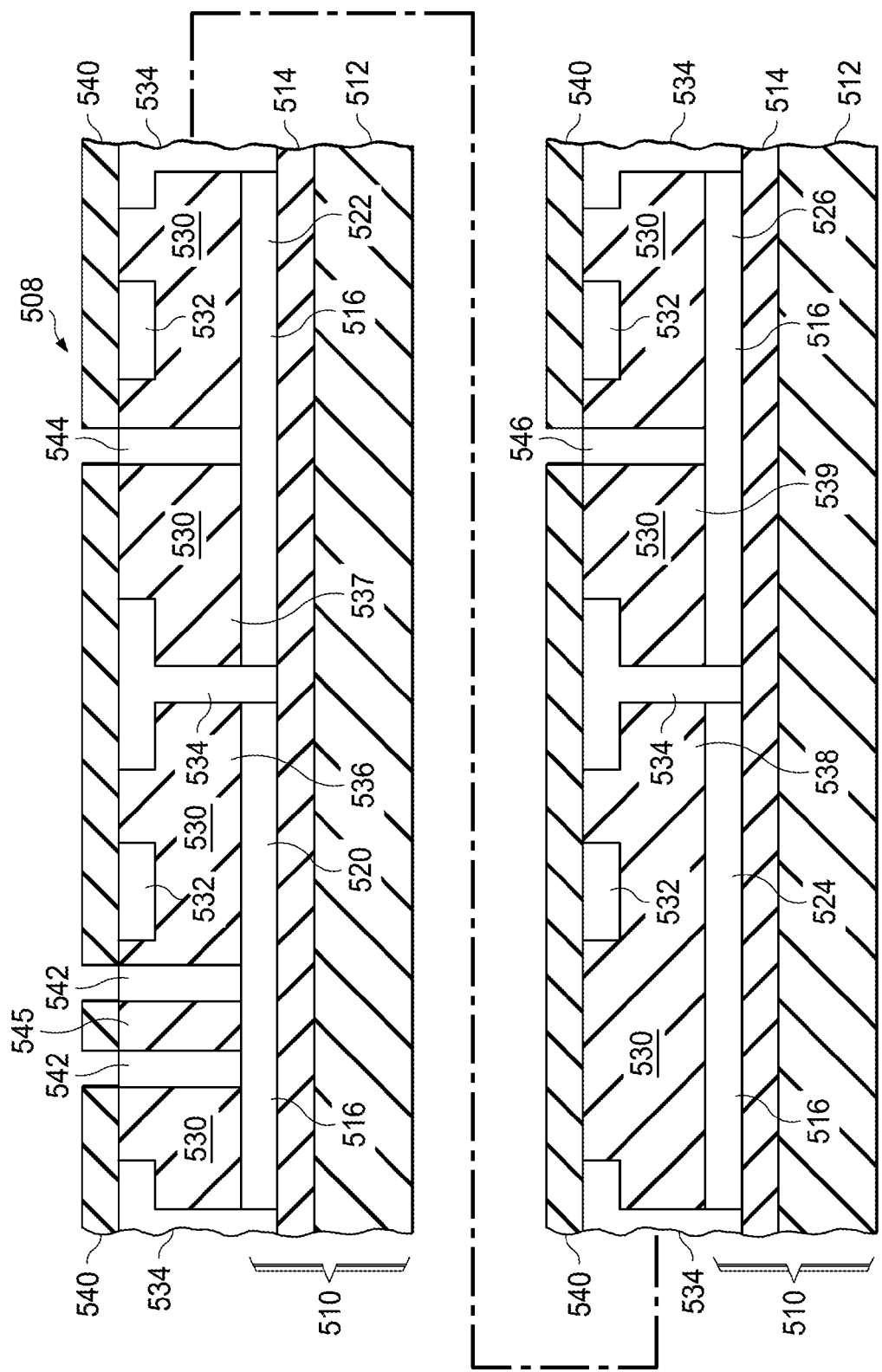

As further shown in FIG. 5A, method 500 begins by forming a patterned photoresist layer 540 in a conventional manner to touch the top surface of epitaxial structure 530. Following the formation of patterned photoresist layer 540, as shown in FIG. 5B, an n-type dopant, such as phosphorous or arsenic, is implanted through patterned photoresist layer 540 to form an n− region 542 with a hollow core, an n− region 544, and an n− region 546. Thus, n− region 542 touches and horizontally surrounds a first center region 545 of silicon epitaxial structure 530, which has a lighter dopant concentration (n−−−).

As further shown in FIG. 5B, n− region 542 extends from the top surface of epitaxial structure 530 vertically down through epitaxial structure 530 to touch p+ buried region 520, while n− region 544 extends from the top surface of epitaxial structure 530 vertically down through epitaxial structure 530 to touch n+ buried region 522, and n− region 546 extends from the top surface of epitaxial structure 530 vertically down through epitaxial structure 530 to touch n+ buried region 526.

In addition, an outer region of silicon epitaxial structure 530 in electrically-isolated silicon region 536, which has the n−−− dopant concentration, touches and horizontally surrounds n− region 542, which has a larger dopant concentration. After the n− regions 542, 544, and 546 have been formed, patterned photoresist layer 540 is removed in a conventional manner.

Figure 5C:
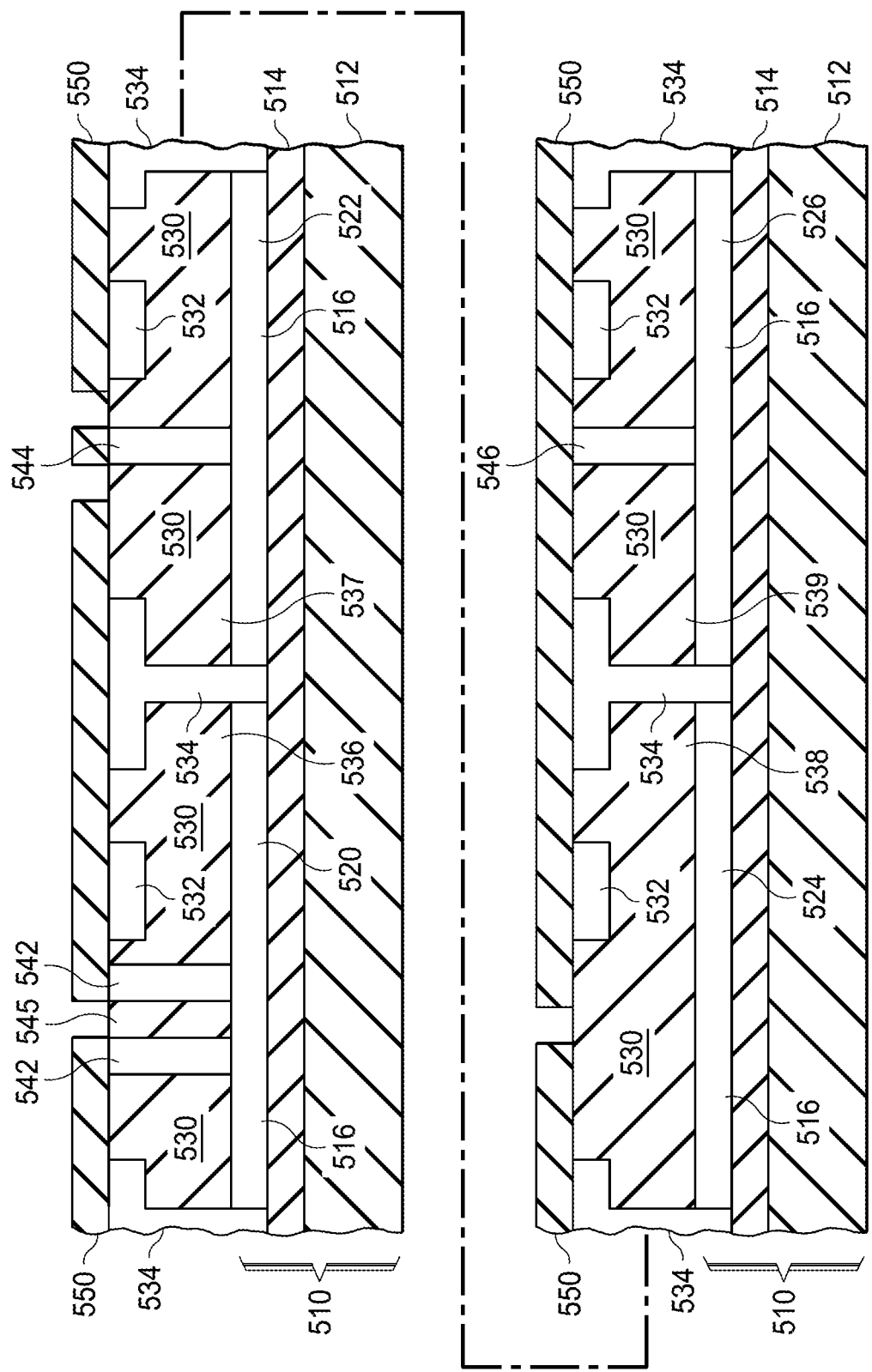
Figure 5D:
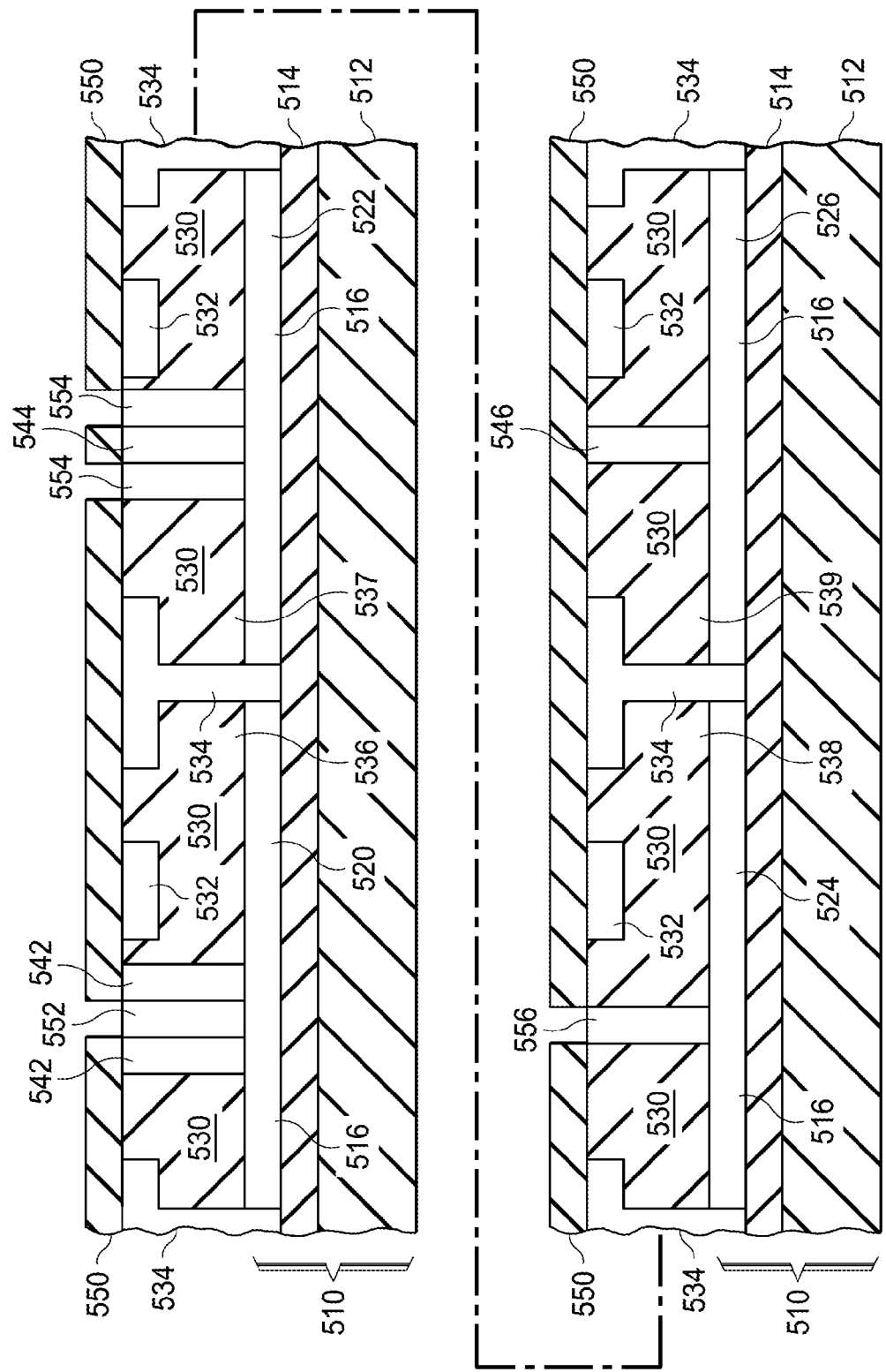

As shown in FIG. 5C, following the removal of patterned photoresist layer 540, a patterned photoresist layer 550 is formed in a conventional manner to touch the top surface of epitaxial structure 530. Following the formation of patterned photoresist layer 550, as shown in FIG. 5D, a p-type dopant, such as boron, is implanted through patterned photoresist layer 550 to form a p− region 552, a p− region 554 with a hollow core, and a p− region 556. Thus, p− region 552 touches and is horizontally surrounded by n− region 542, and p− region 554 touches and horizontally surrounds n− region 544.

As further shown in FIG. 5D, p− region 552 extends from the top surface of epitaxial structure 530 vertically down through epitaxial structure 530 to touch p+ buried region 520, while p− region 554 extends from the top surface of epitaxial structure 530 vertically down through epitaxial structure 530 to touch n+ buried region 522, and p− region 556 extends from the top surface of epitaxial structure 530 vertically down through epitaxial structure 530 to touch p+ buried region 524.

In addition, an outer region of silicon epitaxial structure 530 in electrically-isolated silicon region 537, which has the n−−− dopant concentration, touches and horizontally surrounds p− region 554, which has a larger dopant concentration. After the p− regions 552, 554, and 556 have been formed, patterned photoresist layer 550 is removed in a conventional manner.

Figure 5E:
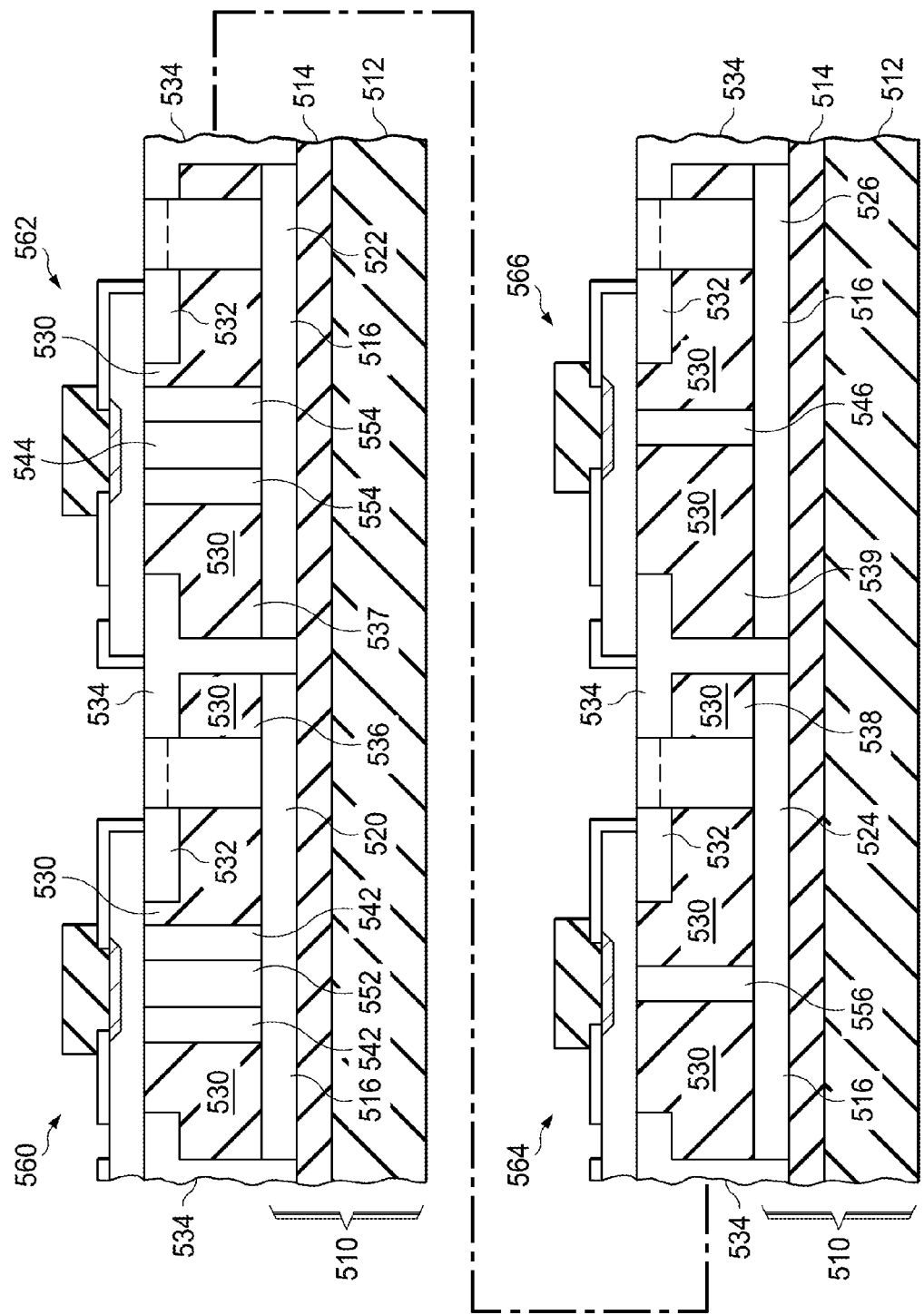

As shown in FIG. 5E, method 500 then continues with the conventional formation of p-type and n-type collector sinker regions (which can alternately be formed before the n− regions 542, 544, and 546 and the p− regions 552, 554, and 556 are formed). Method 500 then follows conventional steps to form a pnp SiGe HBT 560, an npn SiGe HBT 562, a pnp SiGe HBT 564, and an npn SiGe HBT 566.

As shown in FIGS. 4A and 5E, pnp SiGe HBT 560 and npn SiGe HBT 562 are substantially identical to pnp SiGE HBT 420 and npn SiGe HBT 422, respectively. In addition, as shown in FIGS. 1 and 5E, pnp SiGe HBT 564 and npn SiGe HBT 566 are substantially identical to pnp SiGE HBT 190 and npn SiGe HBT 192, respectively. Thus, HBTs 560, 562, 564, and 566 can be formed at the same time without any additional masking steps. In addition, HBTs 560, 562, 564, and 566 can each operate, for example, at the same frequency, with HBTs 560 and 562 providing a greater breakdown voltage.

Figure 6A:
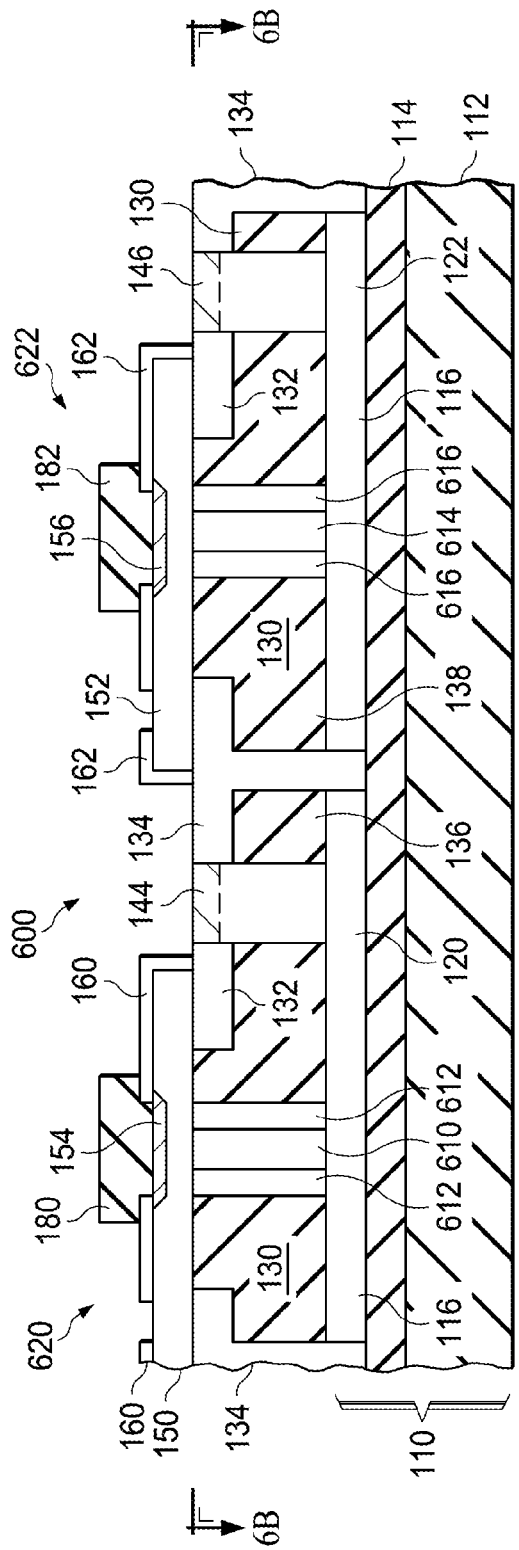
FIGS. 6A-6B are views illustrating a SiGe heterojunction bipolar structure 600 in accordance with an alternate embodiment of the present invention.
Figure 6B:
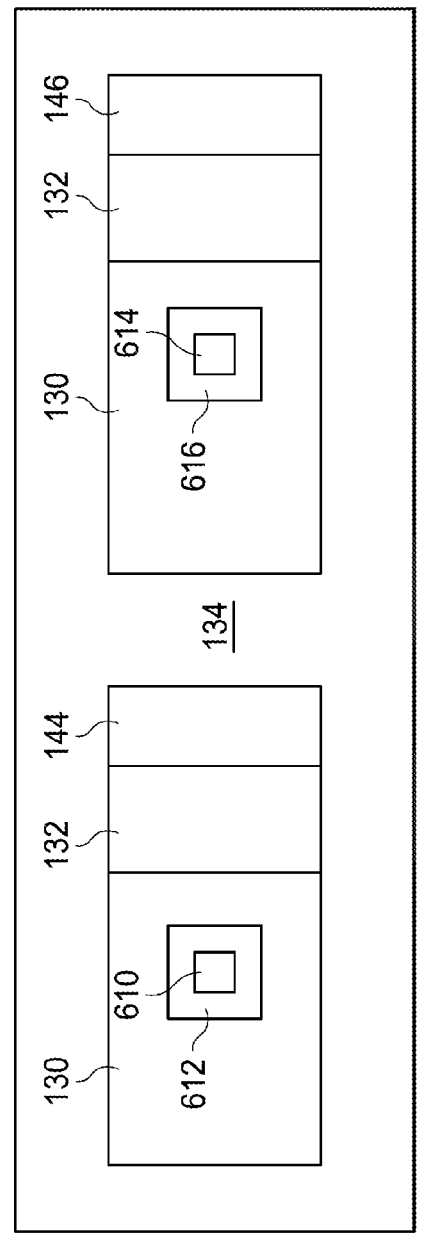

FIGS. 6A-6B show views that illustrate a SiGe heterojunction bipolar structure 600 in accordance with an alternate embodiment of the present invention. FIG. 6A shows a cross-sectional view, while FIG. 6B shows a plan view taken along line 6B-6B of FIG. 6A. SiGe heterojunction bipolar structure 600 is similar to SiGe heterojunction bipolar structure 100 and, as a result, utilizes the same reference numerals to designate the elements that are common to both structures.

As shown in FIGS. 6A-6B, SiGe heterojunction bipolar structure 600 differs from SiGe heterojunction bipolar structure 100 in that SiGe heterojunction bipolar structure 600 replaces p− region 140 with a compensation region 610 and an n− region 612 that horizontally surrounds compensation region 610. Compensation region 610 has both p-type and n-type impurity atoms.

As further shown in FIGS. 6A-6B, compensation region 610 and n− region 612 extend vertically down from SiGe epitaxial structure 150 to p+ buried region 120. In addition, an outer region of silicon epitaxial structure 130 in electrically-isolated silicon region 136, which has the n−−− dopant concentration, touches and horizontally surrounds n− region 612, which has the larger dopant concentration. Further, although FIG. 6B illustrates n− region 612 with a square shape, n− region 612 can alternately be implemented with a circular, oval, or rectangular shape as well as other shapes.

In addition, SiGe heterojunction bipolar structure 600 also differs from SiGe heterojunction bipolar structure 100 in that SiGe heterojunction bipolar structure 600 replaces n− region 142 with a compensation region 614 and a p− region 616 that horizontally surrounds compensation region 614. Compensation region 614 has both p-type and n-type impurity atoms.

As further shown in FIGS. 6A-6B, compensation region 614 and p− region 616 extend vertically down from SiGe epitaxial structure 152 to n+ buried region 122. In addition, an outer region of silicon epitaxial structure 130 in electrically-isolated silicon region 138, which has the n−−− dopant concentration, touches and horizontally surrounds p− region 616, which has a larger dopant concentration. Further, although FIG. 6B illustrates p− region 616 with a square shape, p− region 616 can alternately be implemented with a circular, oval, or rectangular shape as well as other shapes.

In the present example, p+ polysilicon structure 180 and p+ region 154 form the emitter, n− region 612 and the remaining portion of SiGe epitaxial structure 150 form the base, and p+ buried region 120 and p-type contact region 144 form the collector of a pnp SiGe heterojunction bipolar transistor (HBT) 620.

In addition, n+ polysilicon structure 182 and n+ region 156 form the emitter, p− region 616 and the remaining portion of SiGe epitaxial structure 152 form the base, and n+ buried region 122 and n-type contact region 146 form the collector of an npn SiGe HBT 622. PNP SiGe HBT 620 and npn SiGe HBT 622 operate in a conventional manner, can operate with high voltages, and have the same advantages as pnp SiGe HBT 220 and npn SiGe HBT 222.

Figure 7A:
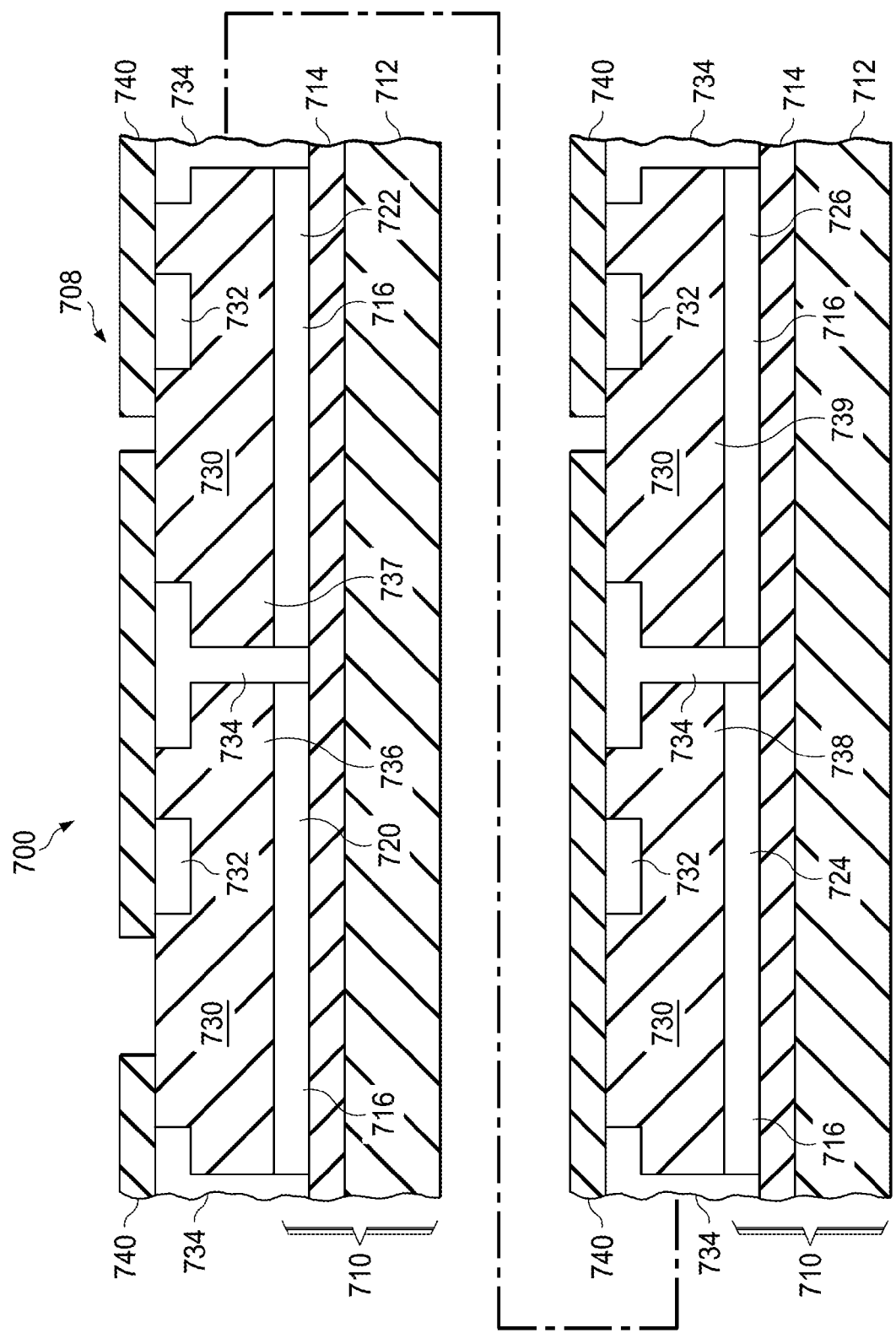
FIGS. 7A-7E are cross-sectional views illustrating a method 700 of forming a SiGe heterojunction bipolar structure in accordance with an alternate embodiment of the present invention.

FIGS. 7A-7E show cross-sectional views that illustrate a method 700 of forming a SiGe heterojunction bipolar structure in accordance with an alternate embodiment of the present invention. As shown in FIG. 7A, the method utilizes a conventionally-formed base structure 708 that includes a silicon-on-oxide (SOI) wafer 710, which has a silicon handle wafer 712, a buried insulation layer 714 that touches silicon handle wafer 712, and a single-crystal silicon substrate 716 that touches buried insulation layer 714. Silicon substrate 716, in turn, has a p+ buried region 720, an n+ buried region 722, a p+ buried region 724, and an n+ buried region 726.

In addition, base structure 708 includes a single-crystal silicon epitaxial structure 730 that touches the top surface of silicon substrate 716. In the present example, epitaxial structure 730 has a very low dopant concentration and an n conductivity type (n−−−), except for regions of out diffusion. For example, a number of p-type atoms out diffuse from p+ buried layer 720 into epitaxial structure 730, a number of n-type atoms out diffuse from n+ buried layer 722 into epitaxial structure 730, a number of p-type atoms out diffuse from p+ buried layer 724 into epitaxial structure 730, and a number of n-type atoms out diffuse from n+ buried layer 726 into epitaxial structure 730. As a result, substantially all of epitaxial structure 730 has a very low dopant concentration.

Base structure 708 also includes a number of shallow trench isolation structures 732 that touch epitaxial structure 730, and a deep trench isolation structure 734 that touches and extends through epitaxial structure 730 as well as silicon substrate 716 to touch buried insulation layer 714. Deep trench isolation structure 734 forms an electrically-isolated silicon region 736, a laterally-adjacent, electrically-isolated silicon region 737, a laterally-adjacent, electrically-isolated silicon region 738, and a laterally-adjacent, electrically-isolated silicon region 739.

Figure 7B:
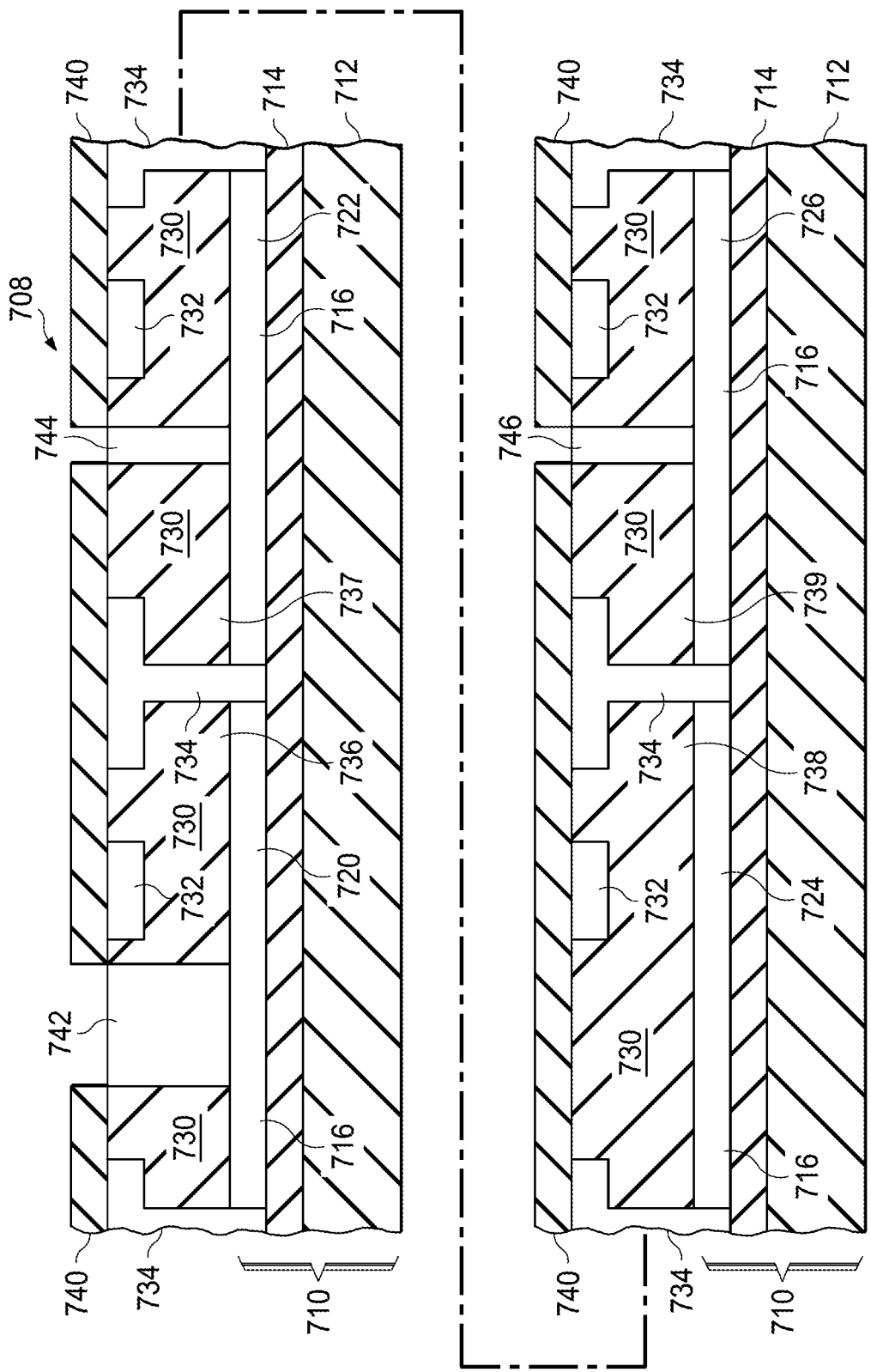

As further shown in FIG. 7A, method 700 begins by forming a patterned photoresist layer 740 in a conventional manner to touch the top surface of epitaxial structure 730. Following the formation of patterned photoresist layer 740, as shown in FIG. 7B, an n-type dopant, such as phosphorous or arsenic, is implanted through patterned photoresist layer 740 to form an n− region 742, an n− region 744, and an n− region 746. N− region 742 is substantially wider than n− region 744 and n− region 746.

As further shown in FIG. 7B, n− region 742 extends from the top surface of epitaxial structure 730 vertically down through epitaxial structure 730 to touch p+ buried region 720, while n− region 744 extends from the top surface of epitaxial structure 730 vertically down through epitaxial structure 730 to touch n+ buried region 722, and n− region 746 extends from the top surface of epitaxial structure 730 vertically down through epitaxial structure 730 to touch n+ buried region 726.

In addition, an outer region of silicon epitaxial structure 730 in electrically-isolated silicon region 736, which has the n−−− dopant concentration, touches and horizontally surrounds n− region 742, which has a larger dopant concentration. After the n− regions 742, 744, and 746 have been formed, patterned photoresist layer 740 is removed in a conventional manner.

Figure 7C:
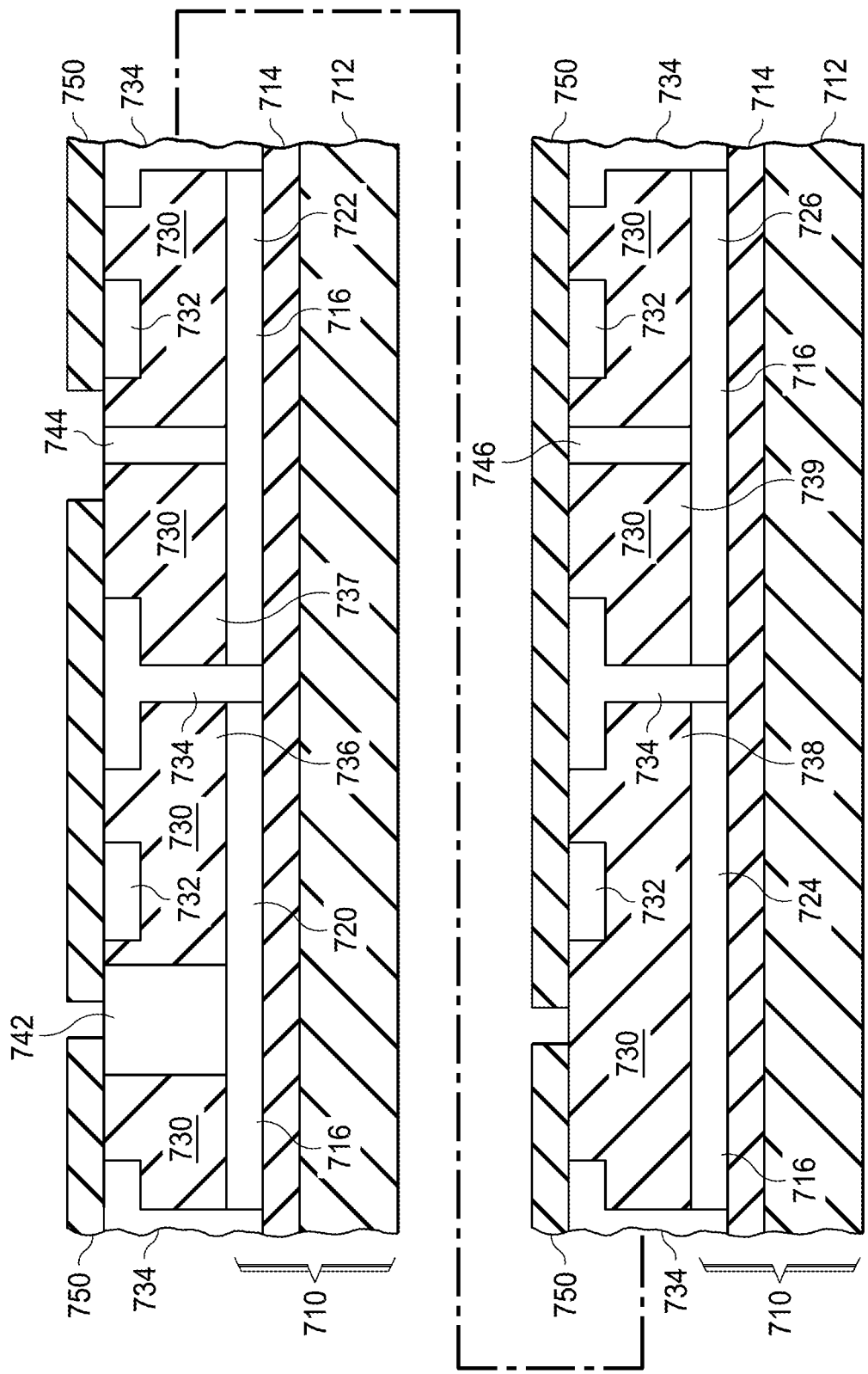

As shown in FIG. 7C, following the removal of patterned photoresist layer 740, a patterned photoresist layer 750 is formed in a conventional manner to touch the top surface of epitaxial structure 730. Following the formation of patterned photoresist layer 750, as shown in FIG. 7D, a p-type dopant, such as boron, is implanted through patterned photoresist layer 750 to form a compensation region 752, an n− region 753 that touches and horizontally surrounds compensation region 752, a compensation region 754, a p− region 756 that touches and horizontally surrounds compensation region 754, and a p− region 758.

Figure 7D:
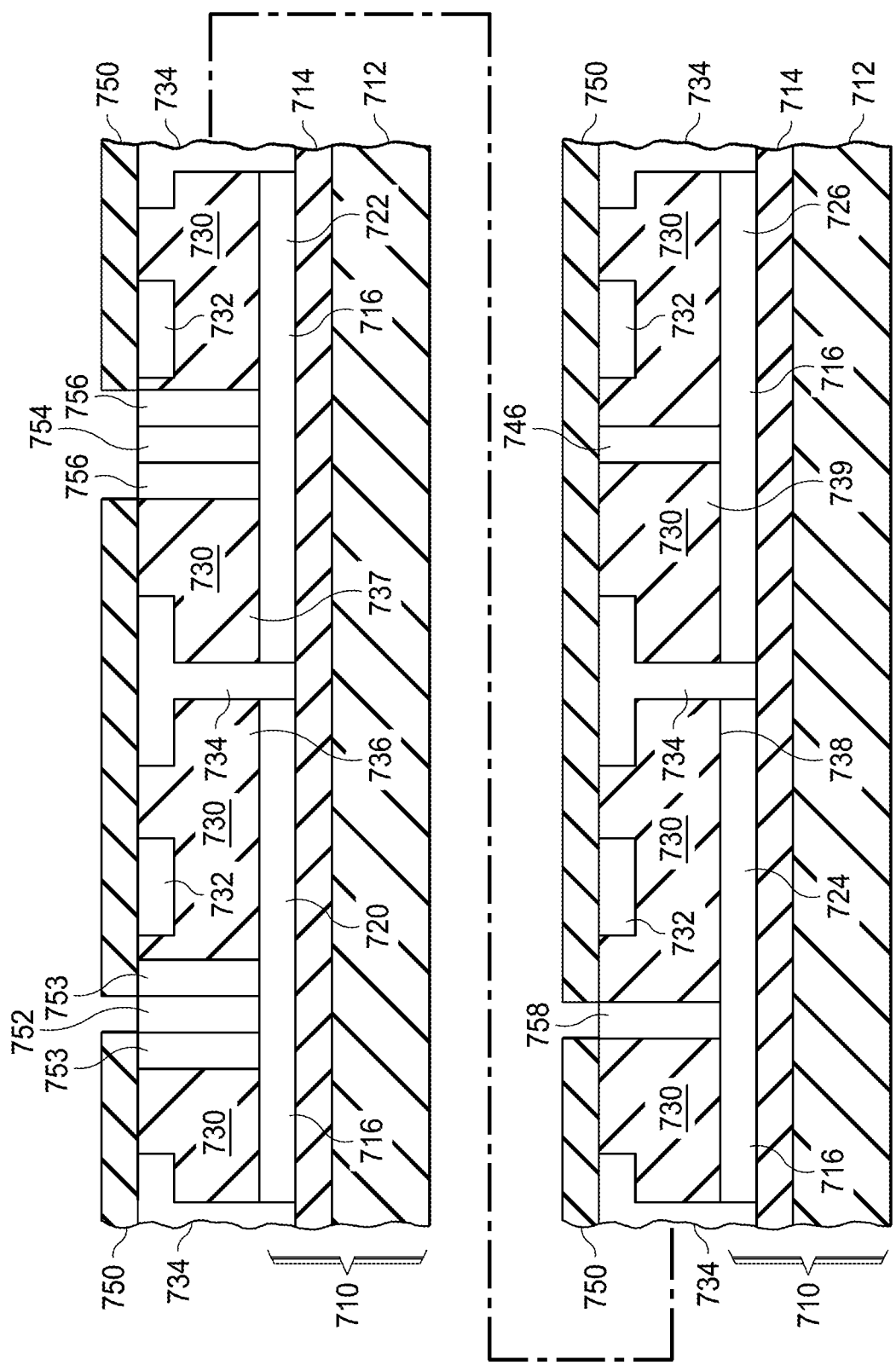

As further shown in FIG. 7D, compensation region 752 and n− region 753 extend from the top surface of epitaxial structure 730 vertically down through epitaxial structure 730 to touch p+ buried region 720, while compensation region 754 and p− region 756 extend from the top surface of epitaxial structure 730 vertically down through epitaxial structure 730 to touch n+ buried region 722, and p− region 758 extends from the top surface of epitaxial structure 730 vertically down through epitaxial structure 730 to touch p+ buried region 724.

In addition, an outer region of silicon epitaxial structure 730 in electrically-isolated silicon region 737, which has the n−−− dopant concentration, touches and horizontally surrounds p− region 756, which has a larger dopant concentration. After the regions 752, 753, 754, 756, and 758 have been formed, patterned photoresist layer 750 is removed in a conventional manner.

Figure 7E:
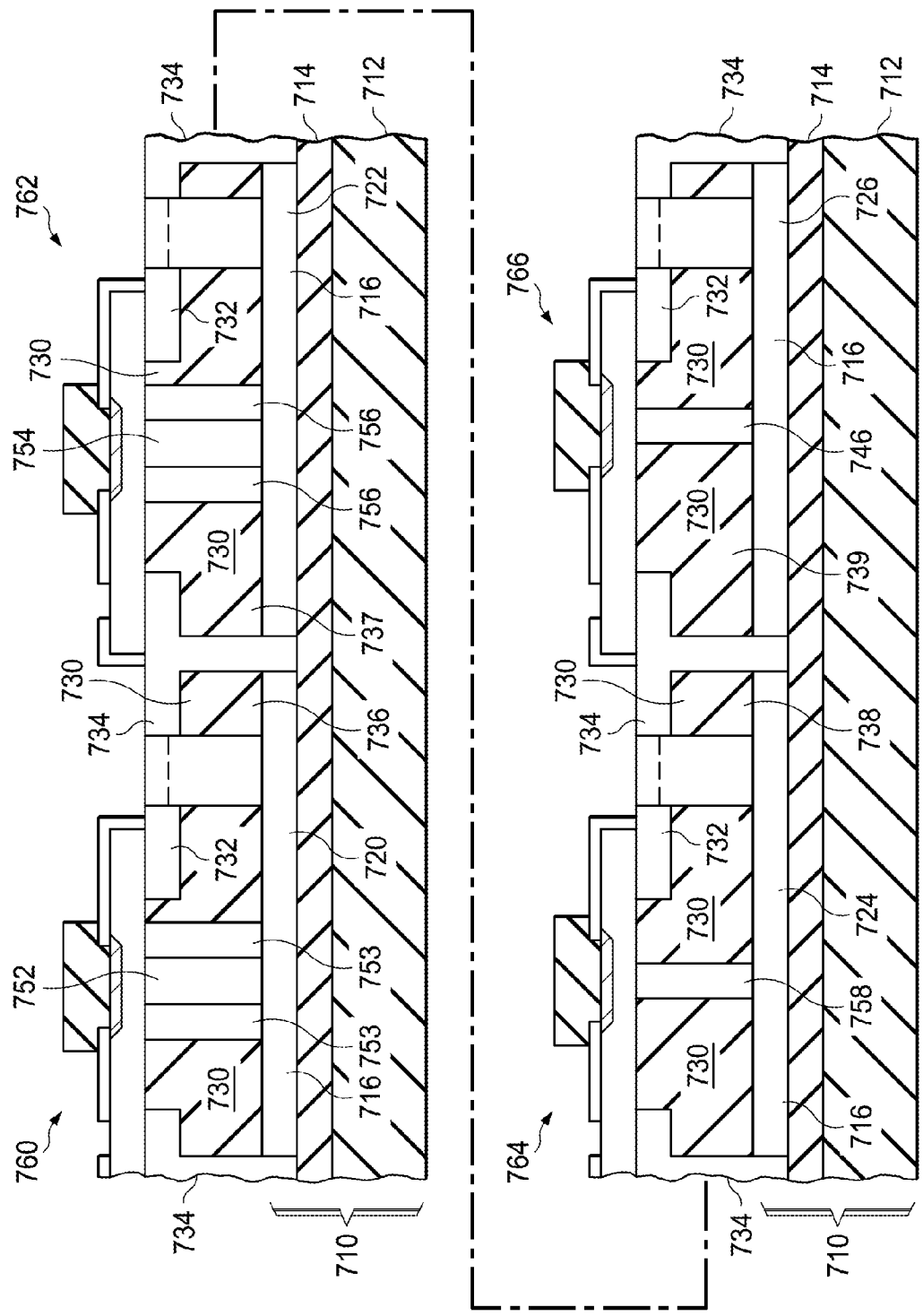

As shown in FIG. 7E, method 700 then continues with the conventional formation of p-type and n-type collector sinker regions (which can alternately be formed before the regions 742, 744, 746, 752, 753, 754, and 756 are formed). Method 700 then follows conventional steps to form a pnp SiGe HBT 760, an npn SiGe HBT 762, a pnp SiGe HBT 764, and an npn SiGe HBT 766.

The predominant dopant type and concentration of compensation regions 752 and 754 depend on the relative dopant concentrations of the n− type and p-type implants. If the dopant concentrations of the n-type and p-type implants are substantially equal, then the compensation regions 752 and 754 are substantially neutral.

As shown in FIGS. 6A and 7E, pnp SiGe HBT 760 and npn SiGe HBT 762 are substantially identical to pnp SiGE HBT 620 and npn SiGe HBT 622, respectively. In addition, as shown in FIGS. 1 and 7E, pnp SiGe HBT 764 and npn SiGe HBT 766 are substantially identical to pnp SiGE HBT 190 and npn SiGe HBT 192, respectively. Thus, HBTs 760, 762, 764, and 766 can be formed at the same time without any additional masking steps. In addition, HBTs 760, 762, 764, and 766 can each operate, for example, at the same frequency, with HBTs 760 and 762 providing a greater breakdown voltage.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A bipolar structure comprising:
a substrate structure having a first conductivity type;
a first epitaxial structure having a top surface and a bottom surface, the bottom surface touching the substrate structure;
a region of a second conductivity type that touches the epitaxial structure, and extends from the top surface of the epitaxial structure down through the epitaxial structure to touch the substrate structure;
a second epitaxial structure having the second conductivity type, a top surface, and a bottom surface, the bottom surface touching the first epitaxial structure and the region of the second conductivity type;
wherein the region of the second conductivity type touches and horizontally surrounds a center region of the first epitaxial structure;
wherein an outer region of the first epitaxial structure touches and horizontally surrounds the region of the second conductivity type; and
wherein the first epitaxial structure has a dopant concentration, and the region of the second conductivity type has a dopant concentration that is larger than the dopant concentration of the first epitaxial structure.

2. The bipolar structure of claim 1 wherein the region of the second conductivity type has a hollow core.

3. A bipolar structure comprising:
a substrate structure having a first conductivity type;
a first epitaxial structure having a top surface and a bottom surface, the bottom surface touching the substrate structure;
a region of a second conductivity type that touches the epitaxial structure, and extends from the top surface of the epitaxial structure down through the epitaxial structure to touch the substrate structure;
a second epitaxial structure having the second conductivity type, a top surface, and a bottom surface, the bottom surface touching the first epitaxial structure and the region of the second conductivity type; and
further comprising a region of the first conductivity type that touches the substrate structure and the second epitaxial structure, the region of the second conductivity type touching and horizontally surrounding the region of the first conductivity type;
wherein an outer region of the first epitaxial structure horizontally surrounds the region of the second conductivity type; and
wherein the first epitaxial structure has a dopant concentration, and the region of the second conductivity type has a dopant concentration that is larger than the dopant concentration of the first epitaxial structure.

4. The bipolar structure of claim 1 and further comprising a compensation region that touches the substrate structure and the second epitaxial structure, the region of the second conductivity type touching and horizontally surrounding the compensation region.

5. The bipolar structure of claim 4 wherein an outer region of the first epitaxial structure horizontally surrounds the region of the second conductivity type.

6. The bipolar structure of claim 3 wherein the region of the second conductivity type has a hollow core.

* * * * *